United States Patent
Kido et al.

(10) Patent No.: US 10,030,133 B2
(45) Date of Patent: Jul. 24, 2018

(54) BLACK PHOTOSENSITIVE RESIN COMPOSITION AND USE OF SAME

(71) Applicant: Kaneka Corporation, Osaka (JP)

(72) Inventors: Masayoshi Kido, Shiga (JP); Yoshihide Sekito, Shiga (JP)

(73) Assignee: KANEKA CORPORATION, Osaka (JP)

( * ) Notice: Subject to any disclaimer, the term of this patent is extended or adjusted under 35 U.S.C. 154(b) by 61 days.

(21) Appl. No.: 14/363,058

(22) PCT Filed: Nov. 20, 2012

(86) PCT No.: PCT/JP2012/080052
§ 371 (c)(1),
(2) Date: Jun. 5, 2014

(87) PCT Pub. No.: WO2013/084714
PCT Pub. Date: Jun. 13, 2013

(65) Prior Publication Data
US 2015/0044451 A1    Feb. 12, 2015

(30) Foreign Application Priority Data
Dec. 6, 2011    (JP) .................. 2011-267268

(51) Int. Cl.
*C08L 33/10*    (2006.01)
*G03F 7/027*    (2006.01)
(Continued)

(52) U.S. Cl.
CPC .............. *C08L 33/10* (2013.01); *C08L 75/14* (2013.01); *G03F 7/027* (2013.01); *G03F 7/105* (2013.01);
(Continued)

(58) Field of Classification Search
CPC ...... Y10T 428/287; C08L 33/10; C08L 75/14; C08L 2201/02; C08L 2205/025; C08L 2205/03; C08L 2203/206
(Continued)

(56) References Cited

U.S. PATENT DOCUMENTS 5,320,928 A * 6/1994 Aoai ................... C08G 18/3878
430/157
2007/0265409 A1* 11/2007 Wakabayashi et al. ........ 528/28
(Continued)

FOREIGN PATENT DOCUMENTS

CN    101846881    9/2010
JP    2002-294131    10/2002
(Continued)

OTHER PUBLICATIONS

Machine translation of JP 2009-271445 (2009).*
(Continued)

*Primary Examiner* — Samir Shah
(74) *Attorney, Agent, or Firm* — Kagan Binder, PLLC

(57) ABSTRACT

Provided is a black photosensitive resin composition being microfabricatable due to its photosensitivity, allowing a cured film obtainable therefrom to be excellent in flexibility, being small in post-curing warpage of a substrate, being excellent in flame retardancy and electric insulation reliability, allowing a reduction in process contamination due to less outgassing during a reflow process, and avoiding a reduction in film thickness. The black photosensitive resin composition contains at least (A) a binder polymer, (B) a thermosetting resin, (C) a flame retardant substantially insoluble in an organic solvent, (D) a photopolymerization initiator, (E) a black colorant reflecting light having a wavelength falling within an infrared range, and (F) an organic solvent, or contains at least (A) a binder polymer, (B) a thermosetting
(Continued)

resin, (G) spherical organic beads, (D) a photopolymerization initiator, (E) a black colorant reflecting light having a wavelength falling within an infrared range, and (F) an organic solvent.

7 Claims, 1 Drawing Sheet

(51) Int. Cl.
    *G03F 7/105*     (2006.01)
    *H05K 3/28*     (2006.01)
    *C08L 75/14*     (2006.01)
    *H05K 1/03*     (2006.01)

(52) U.S. Cl.
    CPC ......... *H05K 1/0373* (2013.01); *H05K 1/0393* (2013.01); *H05K 3/287* (2013.01); *C08L 2201/02* (2013.01); *C08L 2203/206* (2013.01); *C08L 2205/025* (2013.01); *C08L 2205/03* (2013.01); *H05K 2201/012* (2013.01); *H05K 2201/05* (2013.01); *H05K 2203/161* (2013.01); *Y10T 428/254* (2015.01)

(58) Field of Classification Search
    USPC ........................................................ 428/327
    See application file for complete search history.

(56) References Cited

U.S. PATENT DOCUMENTS

| | | |
|---|---|---|
| 2008/0171800 A1 | 7/2008 | Dietz et al. |
| 2009/0065244 A1* | 3/2009 | Kimura .............. C08G 18/0823 174/258 |
| 2013/0048357 A1 | 2/2013 | Ueta et al. |

FOREIGN PATENT DOCUMENTS

| | | | |
|---|---|---|---|
| JP | 2008-257045 | | 10/2008 |
| JP | 2008260910 | | 10/2008 |
| JP | 2009-258613 | | 11/2009 |
| JP | 2009271445 | * | 11/2009 |
| JP | 2010-13558 | | 1/2010 |
| JP | 2010-139559 | | 6/2010 |
| JP | 2011-75678 | | 4/2011 |
| WO | 2011/62053 | | 5/2011 |

OTHER PUBLICATIONS

International Search Report, PCT/JP2012/080052, dated Jan. 22, 2013.
International Preliminary Report on Patentability, PCT/JP2012/080052, dated Jun. 10, 2014.

* cited by examiner

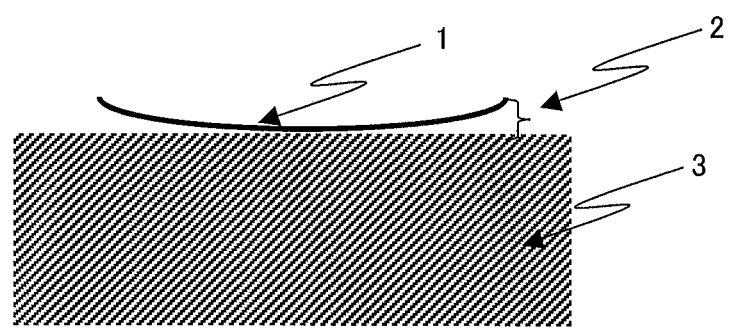

BLACK PHOTOSENSITIVE RESIN COMPOSITION AND USE OF SAME

This application claims benefit from International Application No. PCT/JP2012/080052, which was filed on Nov. 20, 2012, which in turn claims priority to Japanese Application No. 2011-267268, which was filed on Dec. 6, 2011, wherein the entireties of said patent applications are incorporated herein by reference.

TECHNICAL FIELD

The present invention relates to a black photosensitive resin composition and use of the black photosensitive resin composition, more specifically to a black photosensitive resin composition, a resin film, an insulating film, and an insulating film-coated printed wiring board each of which is obtainable from the black photosensitive resin composition.

BACKGROUND ART

Polyimide resin is widely used for electric and electronic purposes due to its excellence in heat resistance, electric insulation reliability, chemical resistance, and mechanical properties. For example, polyimide resin is used as a substrate material and/or a surface protecting material for a flexible circuit board, an integrated circuit board, or the like. Alternatively, polyimide resin is used to provide a semiconductor device with an insulating film and/or a protective coating film, and also to provide a microcircuit with an interlayer insulating film and/or a protective film.

In particular, a cover lay film obtainable by applying an adhesive to a molded article such as a polyimide film or the like is used in a case where polyimide resin is used as a surface protecting material for a flexible circuit board. The cover lay film is generally bonded to the flexible circuit board by providing in advance, by punching or the like, an opening for a junction of the cover lay film with a terminal section or a component of a circuit, positioning the cover lay film and the flexible circuit board, and then carrying out thermo-compression bonding by hot pressing or the like with respect to the cover lay film and the flexible circuit board which have been positioned.

However, it is difficult to provide a fine opening for a thin cover lay film. Further, a cover lay film and a flexible circuit board are frequently manually positioned so as to be combined. This causes not only a deterioration in positional accuracy but also a deterioration in workability of the combining, and consequently causes an increase in cost.

Meanwhile, a solder resist, for example may be used as a surface protecting material for a circuit board. In particular, a solder resist having a photosensitive function is preferably used in a case where fine processing is required. A photosensitive resin composition which consists mainly of acid-modified epoxy acrylate, epoxy resin, or the like is used as such a photosensitive solder resist. However, the photosensitive solder resist is low in mechanical properties such as bending resistance and the like and large in cure shrinkage while being excellent in electric insulation reliability as an insulating material. Therefore, in a case where the solder resist is laminated on a circuit board such as a flexible circuit board or the like which is thin and rich in flexibility, the circuit board is largely warped. This makes it difficult to use the photosensitive solder resist for a flexible circuit board.

In recent years, an attempt has been made to protect, as below, confidential information which is included in a circuit pattern. The confidential information is protected by covering the circuit pattern by coloring black a cover lay film or a photosensitive solder resist, which serves as a surface protecting material for a circuit board, so as to provide the cover lay film or the photosensitive solder resist with coverability.

In particular, it is important for a photosensitive solder resist to have both (i) photosensitivity, flexibility, heat resistance, and plating resistance, and (ii) blackness and coverability. Against a background of this, various proposals have been made for allowing these properties to be apparent.

For example, a black photo solder resist which has sufficient blackness and is excellent in resolution has been proposed (for example, refer to Patent Literature 1).

Further, black photo solder resist ink which is highly photo-curable has been proposed (for example, refer to Patent Literature 2).

CITATION LIST

Patent Literatures

Patent Literature 1
Japanese Patent Application Publication, Tokukai, No. 2008-257045 A
Patent Literature 2
Japanese Patent Application Publication, Tokukai, No. 2002-294131 A

SUMMARY OF INVENTION

Technical Problem

However, the inventions disclosed in Patent Literatures 1 and 2 each have a problem of being poor in bending resistance, large in post-curing warpage, and less flame-retardant while being excellent in resolution, blackness, heat resistance, and gold plating resistance. Further, the inventions disclosed in Patent Literatures 1 and 2 each also have a disadvantage of causing a problem such that outgassing in a large amount and a reduction in film thickness occur during a reflow process carried out for component mounting.

Solution to Problem

Inventors of the present invention diligently studied to solve the problems, and finally found that a black photosensitive resin composition containing at least (A) a binder polymer, (B) a thermosetting resin, (C) a flame retardant which is substantially insoluble in an organic solvent, (D) a photopolymerization initiator, (E) a black colorant which reflects light having a wavelength falling within an infrared range, and (F) an organic solvent, or a black photosensitive resin composition containing at least (A) a binder polymer, (B) a thermosetting resin, (G) spherical organic beads, (D) a photopolymerization initiator, (E) a black colorant which reflects light having a wavelength falling within an infrared range, and (F) an organic solvent is microfabricatable due to its photosensitivity. Further, the inventors also confirmed that a cured film obtainable from the black photosensitive resin composition is excellent in flexibility, small in post-curing warpage of a substrate, and excellent in flame retardancy and electric insulation reliability, and causes less outgassing during a reflow process, thereby (i) allowing a reduction in process contamination and (ii) avoiding a reduction in film thickness. Therefore, the inventors acquired knowledge that it is possible to obtain a black photosensitive resin composition, a resin film, an insulating film, and an insulating film-coated printed wiring board each of which is excellent in these properties. Then, the inventors attained the present invention in accordance with such knowledge. The present invention allows a black photosensitive resin composition including the following novel feature to solve the problems.

That is, a black photosensitive resin composition in accordance with the present invention is a black photosensitive resin composition containing at least (A) a binder polymer, (B) a thermosetting resin, (C) a flame retardant which is substantially insoluble in an organic solvent, (D) a photopolymerization initiator, (E) a black colorant which reflects light having a wavelength falling within an infrared range, and (F) an organic solvent, or a black photosensitive resin composition containing at least (A) a binder polymer, (B) a thermosetting resin, (G) spherical organic beads, (D) a photopolymerization initiator, (E) a black colorant which reflects light having a wavelength falling within an infrared range, and (F) an organic solvent. Alternatively, the black photosensitive resin composition in accordance with the present invention is more preferably a black photosensitive resin composition containing at least (A) a binder polymer, (B) a thermosetting resin, (C) a flame retardant which is substantially insoluble in an organic solvent, (G) spherical organic beads, (D) a photopolymerization initiator, (E) a black colorant which reflects light having a wavelength falling within an infrared range, and (F) an organic solvent. The black photosensitive resin composition in accordance with the present invention is preferably arranged such that (E) the black colorant which reflects light having a wavelength falling within an infrared range is a metal composite oxide or an organic pigment. The black photosensitive resin composition in accordance with the present invention is more preferably arranged such that the metal composite oxide contains at least one kind selected from the group consisting of iron, chromium, manganese, and bismuth. The black photosensitive resin composition in accordance with the present invention is more preferably arranged such that the organic pigment is a perylene compound. The black photosensitive resin composition in accordance with the present invention is more preferably arranged such that (C) the flame retardant which is substantially insoluble in an organic solvent is at least one kind selected from the group consisting of (c1) a phosphorus compound, (c2) a melamine compound, and (c3) a metal hydroxide.

A resin film in accordance with the present invention is obtainable by applying, to a substrate surface, a black photosensitive resin composition mentioned above, and drying the black photosensitive resin composition.

An insulating film in accordance with the present invention is obtainable by curing the resin film mentioned above.

An insulating film-coated printed wiring board in accordance with the present invention includes a printed wiring board or a flexible printed wiring board coated with the insulating film mentioned above.

Advantageous Effects of Invention

As described earlier, a black photosensitive resin composition in accordance with the present invention is arranged to contain at least (A) a binder polymer, (B) a thermosetting resin, (C) a flame retardant which is substantially insoluble in an organic solvent, (D) a photopolymerization initiator, (E) a black colorant which reflects light having a wavelength falling within an infrared range, and (F) an organic solvent, or is arranged to contain at least (A) a binder polymer, (B) a thermosetting resin, (G) spherical organic beads, (D) a photopolymerization initiator, (E) a black colorant which reflects light having a wavelength falling within an infrared range, and (F) an organic solvent. Therefore, the black photosensitive resin composition in accordance with the present invention is microfabricatable due to its photosensitivity. Further, a cured film obtainable from the black photosensitive resin composition is excellent in flexibility, small in post-curing warpage of a substrate, and excellent in flame retardancy and electric insulation reliability, and causes less outgassing during a reflow process, thereby (i) allowing a reduction in process contamination and (ii) avoiding a reduction in film thickness. Alternatively, a black photosensitive resin composition in accordance with the present invention is more preferably arranged to contain at least (A) a binder polymer, (B) a thermosetting resin, (C) a flame retardant which is substantially insoluble in an organic solvent, (G) spherical organic beads, (D) a photopolymerization initiator, (E) a black colorant which reflects light having a wavelength falling within an infrared range, and (F) an organic solvent. Accordingly, the black photosensitive resin composition in accordance with the present invention yields an excellent effect of being suitably usable as a surface protecting material or the like for various circuit boards. Further, it is possible to provide a resin film, an insulating film, and an insulating film-coated printed wiring board each of which is obtainable from the black photosensitive resin composition.

BRIEF DESCRIPTION OF DRAWINGS

FIG. 1 schematically shows how a warpage height of a film is measured.

DESCRIPTION OF EMBODIMENTS

The following description specifically discusses a black photosensitive resin composition in accordance with the present invention.

It is only necessary that a black photosensitive resin composition in accordance with the present invention contain at least (A) a binder polymer, (B) a thermosetting resin, (C) a flame retardant which is substantially insoluble in an organic solvent, (D) a photopolymerization initiator, (E) a black colorant which reflects light having a wavelength falling within an infrared range, and (F) an organic solvent. Alternatively, it is only necessary that a black photosensitive resin composition in accordance with the present invention contain at least (A) a binder polymer, (B) a thermosetting resin, (G) spherical organic beads, (D) a photopolymerization initiator, (E) a black colorant which reflects light having a wavelength falling within an infrared range, and (F) an organic solvent. It is preferable that a black photosensitive resin composition in accordance with the present invention contain at least (A) a binder polymer, (B) a thermosetting resin, (C) a flame retardant which is substantially insoluble in an organic solvent, (G) spherical organic beads, (D) a photopolymerization initiator, (E) a black colorant which reflects light having a wavelength falling within an infrared range, and (F) an organic solvent.

Note here that the inventors, who found that the black photosensitive resin composition has various excellent properties, suppose that the black photosensitive resin composition has the various excellent properties due to the following reason. Problems of outgassing and film thinning each occurring during a reflow process were newly found while the inventors were diligently studying the black photosensitive resin composition. It is expected that such problems occur due to the following reason. Since heating is carried out by use of an infrared heater during the reflow process, infrared absorption by a black colorant causes an increase in surface temperature of a photosensitive resin composition layer to a decomposition temperature of a photosensitive resin composition, so that outgassing in a large amount occurs by decomposition of the photosensitive resin composition, and consequently film thinning occurs. Accordingly, it is expected that, in a case where the black colorant ((E) component) which reflects light having a wavelength falling within an infrared range is used as the black colorant, it is possible to prevent outgassing and film thinning from occurring during the reflow process. It is also expected that use of the flame retardant ((C) component) which is substantially insoluble in an organic solvent makes it possible (i) to prevent outgassing caused due to decomposition of a flame retardant while securing a flame retardancy of the black photosensitive resin composition, and (ii) to allow the black photosensitive resin composition to be excellent in electric insulation property because no bleedout of a flame retardant occurs. Furthermore, it is expected that use of the spherical organic beads ((G) component) makes it possible to effectively form unevenness on an insulating film obtainable from the black photosensitive resin composition, so that the insulating film is excellent in tack-free property. Moreover, it is expected that obtainment of a filling effect yielded by the (G) component lowers the warpage of the insulating film obtainable from the black photosensitive resin composition and thus causes an increase in stress relaxation effect and fracture toughness, so that the insulating film improves in flexibility greatly enough to be resistant to repeated bending. Further, it is expected that the (G) component, which is polymer particles, has less influence on occurrence of outgassing. It is expected here that use of both the flame retardant ((C) component) which is substantially insoluble in an organic solvent and the spherical organic beads ((G) component) makes it easier to well balance the above properties.

The following description discusses (A) the binder polymer, (B) the thermosetting resin, (C) the flame retardant which is substantially insoluble in an organic solvent, (D) the photopolymerization initiator, (E) the black colorant which reflects light having a wavelength falling within an infrared range, (F) the organic solvent, (G) the spherical organic beads, and the other components, and a method for mixing the black photosensitive resin composition.

<(A) Binder Polymer>

(A) The binder polymer of the present invention is a polymer which is soluble in an organic solvent and has a weight average molecular weight of not less than 1,000 and not more than 1,000,000 based on polyethylene glycol.

For example, the organic solvent is exemplified by, but not particularly limited to sulfoxide solvents such as dimethyl sulfoxide, diethyl sulfoxide, and the like; formamide solvents such as N,N-dimethylformamide, N,N-diethylformamide, and the like; acetamide solvents such as N,N-dimethyl acetamide, N,N-diethyl acetamide, and the like; pyrrolidone solvents such as N-methyl-2-pyrrolidone, N-vinyl-2-pyrrolidone, and the like; hexamethylphosphoramide; γ-butyrolactone; and the like. Further, according to need, it is possible to use, in combination, such an organic solvent as mentioned above and aromatic hydrocarbon such as xylene, toluene, or the like.

For example, the organic solvent is further exemplified by symmetric glycol diether solvents such as methylmonoglyme(1,2-dimethoxy ethane), methyldiglyme(bis(2-methoxy ethyl)ether), methyltriglyme(1,2-bis(2-methoxyethoxy)ethane), methyltetraglyme(bis[2-(2-methoxyethoxyethyl)]ether), ethylmonoglyme(1,2-diethoxyethane), ethyldiglyme(bis(2-ethoxyethyl)ether), butyldiglyme(bis(2-butoxyethyl)ether), and the like; acetate solvents such as methyl acetate, ethyl acetate, isopropyl acetate, n-propyl acetate, butyl acetate, propylene glycol monomethyl ether acetate, ethylene glycol monobutyl ether acetate, diethylene glycol monoethyl ether acetate (another name: Carbitol acetate, 2-(2-butoxy ethoxy)ethyl) acetate, diethylene glycol monobutyl ether acetate, 3-methoxybutyl acetate, ethylene glycol monomethyl ether acetate, ethylene glycol monoethyl ether acetate, dipropylene glycol methyl ether acetate, propylene glycol diacetate, 1,3-butylene glycol diacetate, and the like; and ether solvents such as dipropylene glycol methyl ether, tripropylene glycol methyl ether, propylene glycol n-propyl ether, dipropylene glycol n-propyl ether, propylene glycol n-butyl ether, dipropylene glycol n-butyl ether, tripropylene glycol n-propyl ether, propylene glycol phenyl ether, dipropylene glycol dimethyl ether, 1,3-dioxolane, ethylene glycol monobutyl ether, diethylene glycol monoethyl ether, diethylene glycol monobutyl ether, ethylene glycol monoethyl ether, and the like.

Organic solvent solubility, which is an indicator for determining whether or not a binder polymer is soluble in an organic solvent, can be determined by measuring parts by weight of a binder polymer to be dissolved in 100 parts by weight of an organic solvent. In a case where not less than 5 parts by weight of a binder polymer has been dissolved in 100 parts by weight of the organic solvent, it is possible to determine that the binder polymer is soluble in the organic solvent. For example, a method for measuring the organic solvent solubility is exemplified by, but not particularly limited to a method in which 5 parts by weight of a binder polymer is added to 100 parts by weight of an organic solvent, and a resultant mixture is stirred at 40° C. for 1 hour, cooled to a room temperature (23° C.), and left to stand for not less than 24 hours. Then, in a case where it is confirmed that the mixture is a uniform solution in which no undissolved matter or precipitate is formed, it is determined that the binder polymer is soluble in the organic solvent.

For example, a weight average molecular weight of the (A) component can be measured under the following measurement condition in the present invention.

(Measurement Condition Under which Weight Average Molecular Weight is Measured)

Used device: counterpart of HLC-8220GPC manufactured by TOSOH CORPORATION
Column: TSK gel Super AWM-H (6.0 mm I. D.×15 cm) manufactured by TOSOH CORPORATION×2
Guard column: TSK guard column Super AW-H manufactured by TOSOH CORPORATION
Eluent: 30 mM LiBr+20 mM H3PO4 in DMF
Flow rate: 0.6 mL/min
Column temperature: 40° C.
Detection condition: RI: polarity (+), response (0.5 sec)
Sample concentration: approximately 5 mg/mL
Standard sample: PEG (polyethylene glycol)

It is preferable in the present invention to control the weight average molecular weight of the (A) component so that the (A) component has a weight average molecular weight falling within a range of not less than 1,000 and not more than 1,000,000 based on polyethylene glycol. This is because the (A) component which has a weight average molecular weight falling within the above range allows excellent flexibility and chemical resistance of a cured film to be obtained. The (A) component which has a weight average molecular weight of less than 1,000 may cause a deterioration in flexibility and chemical resistance, and the (A) component which has a weight average molecular weight of more than 1,000,000 may cause an increase in viscosity of the black photosensitive resin composition.

For example, the (A) component of the present invention is exemplified by, but not particularly limited to polyurethane resin, poly(meth)acrylic resin, polyvinyl resin, polystyrene resin, polyethylene resin, polypropylene resin, polyimide resin, polyamide resin, polyacetal resin, polycarbonate resin, polyester resin, polyphenylene ether resin, polyphenylene sulfide resin, polyethersulfone resin, and polyether ether ketone resin, and these resins can be used alone or in combination of two or more kinds. In particular, it is preferable to use, as the (A) component of the present invention, polyurethane resin that is a resin which has a urethane bond in its molecule, or poly(meth)acrylic resin. This is because the polyurethane resin or the poly(meth)acrylic resin allows a cured film obtainable by curing the black photosensitive resin composition to improve in flexibility and bending resistance, and be low in warpage.

A resin of the present invention which resin has a urethane bond in its molecule is a polymer which is soluble in an organic solvent, has, in its molecule, a repeating unit containing at least one urethane bond, and has a weight average molecular weight of not less than 1,000 and not more than 1,000,000 based on polyethylene glycol.

The resin of the present invention which resin has a urethane bond in its molecule can be obtained through any reaction. For example, by reacting a diol compound represented by the following general formula (1):

[Chem. 1]

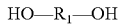  general formula (1)

wherein $R_1$ represents a divalent organic group; and a diisocyanate compound represented by the following general formula (2):

[Chem. 2]

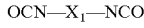  general formula (2)

wherein $X_1$ represents a divalent organic group, the resin which has a urethane bond in its molecule is obtained as a structure which has, in its molecule, a repeating unit having a urethane bond and which is represented by the following general formula (3):

[Chem. 3]

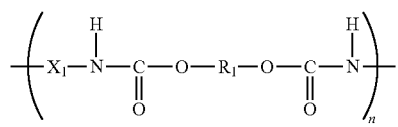  general formula (3)

wherein $R_1$ and $X_1$ independently represent a divalent organic group, and n represents an integer of not less than 1.

The diol compound of the present invention is not particularly limited provided that the diol compound has a structure represented by the general formula (1). For example, the diol compound is exemplified by alkylenediols such as ethylene glycol, diethylene glycol, propylene glycol, 1,3-butanediol, 1,4-butanediol, 1,5-pentanediol, neopentyl glycol, 3-methyl-1,5-pentanediol, 1,6-hexanediol, 1,7-heptanediol, 1,8-octanediol, 2-methyl-1,8-octanediol, 1,9-nonanediol, 1,10-decanediol, 1,4-cyclohexanediol, 1,4-cyclohexanedimethanol, and the like; polyoxyalkylenediols such as polyethylene glycol, polypropylene glycol, polytetramethylene glycol, a random copolymer of tetramethylene glycol and neopentyl glycol, and the like; polyester diols obtained by reacting polyhydric alcohol and polybasic acid together; polycarbonate diols having a carbonate skeleton; polycaprolactone diols obtained by a ring-opening addition reaction of a lactone such as γ-butyl lactone, ε-caprolactone, δ-valerolactone, or the like; bisphenol-A; an ethylene oxide adduct of bisphenol-A; a propylene oxide adduct of bisphenol-A; hydrogenated bisphenol-A; an ethylene oxide adduct of hydrogenated bisphenol-A; a propylene oxide adduct of hydrogenated bisphenol-A; and the like. These diol compounds can be used alone or in combination of two or more kinds.

In particular, it is preferable to use, as the diol compound of the present invention, a long-chain diol such as polyethylene glycol, polypropylene glycol, polytetramethylene glycol, polyoxyalkylenediol, polyester diol, polycarbonate diol, polycaprolactone diol, or the like. This is because the long-chain diol allows a cured film obtainable by curing the black photosensitive resin composition to have a lower elastic coefficient, improve in flexibility and bending resistance, and be low in warpage.

The diisocyanate compound of the present invention is not particularly limited provided that the diisocyanate compound has a structure represented by the general formula (2). For example, the diisocyanate compound is exemplified by aromatic diisocyanate compounds such as diphenylmethane-2,4'-diisocyanate, 3,2'-dimethyl diphenylmethane-2,4'-diisocyanate, 3,3'-dimethyl diphenylmethane-2,4'-diisocyanate, 4,2'-dimethyl diphenylmethane-2,4'-diisocyanate, 4,3'-dimethyl diphenylmethane-2,4'-diisocyanate, 5,2'-dimethyl diphenylmethane-2,4'-diisocyanate, 5,3'-dimethyl diphenylmethane-2,4'-diisocyanate, 6,2'-dimethyl diphenylmethane-2,4'-diisocyanate, 6,3'-dimethyl diphenylmethane-2,4'-diisocyanate, 3,2'-diethyl diphenylmethane-2,4'-diisocyanate, 3,3'-diethyl diphenylmethane-2,4'-diisocyanate, 4,2'-diethyl diphenylmethane-2,4'-diisocyanate, 4,3'-diethyl diphenylmethane-2,4'-diisocyanate, 5,2'-diethyl diphenylmethane-2,4'-diisocyanate, 5,3'-diethyl diphenylmethane-2,4'-diisocyanate, 6,2'-diethyl diphenylmethane-2,4'-diisocyanate, 6,3'-diethyl diphenylmethane-2,4'-diisocyanate, 3,2'-dimethoxy diphenylmethane-2,4'-diisocyanate, 3,3'-dimethoxy diphenylmethane-2,4'-diisocyanate, 4,2'-dimethoxy diphenylmethane-2,4'-diisocyanate, 4,3'-dimethoxy diphenylmethane-2,4'-diisocyanate, 5,2'-dimethoxy diphenylmethane-2,4'-diisocyanate, 5,3'-dimethoxy diphenylmethane-2,4'-diisocyanate, 6,2'-dimethoxy diphenylmethane-2,4'-diisocyanate, 6,3'-dimethoxy diphenylmethane-2,4'-diisocyanate, diphenylmethane-4,4'-diisocyanate, diphenylmethane-3,3'-diisocyanate, diphenylmethane-3,4'-diisocyanate, diphenyl ether-4,4'-diisocyanate, benzophenone-4,4'-diisocyanate, diphenyl sulfone-4,4'-diisocyanate, tolylene-2,4-diisocyanate, tolylene-2,6-diisocyanate, m-xylylene diisocyanate, p-xylylene diisocyanate, naphthalene-2,6-diisocyanate, 4,4'-[2,2-bis(4-phenoxyphenyl)propane]diisocyanate, and the like; alicyclic diisocyanate compounds such as hydrogenated diphenylmethane diisocyanate, hydrogenated xylylene diisocyanate, isophorone diisocyanate, norbornene diisocyanate, and the like; aliphatic diisocyanate compounds such as hexamethylene diisocyanate, trimethyl hexamethylene diisocyanate, lysine diisocyanate, and the like; and the like. These compounds can be used alone or in combination of two or more kinds.

In particular, it is preferable to use, as the diisocyanate compound of the present invention, an alicyclic diisocyanate compound and an aliphatic diisocyanate compound. This is because the alicyclic diisocyanate compound and the aliphatic diisocyanate compound allow the black photosensitive resin composition to be excellent in photosensitivity.

The resin of the present invention which resin has a urethane bond in its molecule is synthesized by mixing the diol compound and the diisocyanate compound so that a ratio between the number of hydroxyl groups and the number of isocyanate groups (isocyanate group/hydroxyl group) is not less than 0.5 and not more than 2.0, and then reacting the diol compound and the diisocyanate compound by use of no solvent or in an organic solvent.

In a case where two or more kinds of diol compounds are used to synthesize the resin of the present invention which resin has a urethane bond in its molecule, the diol compounds may be reacted with a diisocyanate compound after being mixed with each other, or the diol compounds and the diisocyanate compound may be reacted separately. Alternatively, after reacting a diol compound and a diisocyanate compound, it is possible to react a terminal isocyanate group of an obtained resin and another diol compound together, and further to react a product of the reaction and the diisocyanate compound. Same applies to a case where two or more kinds of diisocyanate compounds are used. A desired resin which has a urethane bond in its molecule can be produced by use of the method described above.

The diol compound and the diisocyanate compound react with each other at a temperature preferably of not less than 40° C. and not more than 160° C., and more preferably of not less than 60° C. and not more than 150° C. The reaction at a temperature of less than 40° C. causes a reaction time to be too long, and the reaction at a temperature of more than 160° C. is highly likely to cause gelatinization due to occurrence of a three-dimensional structure-forming reaction during the reaction. A time of the reaction between the diol compound and the diisocyanate compound can be appropriately selected in accordance with a batch scale or a reaction condition to be employed. Further, according to need, the reaction may be carried out in the presence of a catalyst such as a tertiary amine; alkali metal; alkaline earth metal; metal such as tin, zinc, titanium, cobalt, or the like; a semimetal compound; or the like.

The reaction between the diol compound and the diisocyanate compound, which reaction can be caused by use of no solvent, is desirably caused by use of an organic solvent so as to control the reaction. For example, an organic solvent usable for the reaction is exemplified by, but not particularly limited to the organic solvents mentioned earlier.

It is desirable that an amount in which an organic solvent is used for the reaction between the diol compound and the diisocyanate compound be set so that a reaction solution has a solute weight concentration, i.e., a solution concentration of not less than 5 wt % and not more than 90 wt %. More preferably, it is desirable that the reaction solution have a solute weight concentration of not less than 10 wt % and not more than 80 wt %. The reaction solution which has a solution concentration of less than 5 wt % is not preferable because the reaction solution prevents a polymerization reaction from being easily initiated and causes a reaction rate to be slow, whereby a desired structured material would not be obtained. The reaction solution which has a solution concentration of more than 90 wt % causes the reaction solution to have high viscosity and may prevent the reaction from occurring uniformly.

The resin of the present invention which resin has a urethane bond in its molecule preferably has at least one kind of an organic group selected from the group consisting of (a1) a (meth)acryloyl group, (a2) a carboxyl group, and (a3) an imide group. In a case where the resin of the present invention which resin has a urethane bond in its molecule has (a1) the (meth)acryloyl group, which is an acryloyl group and/or a methacryloyl group, the black photosensitive resin composition improves in photosensitivity. Therefore, the resin can be cured by short-time ultraviolet irradiation. In a case where the resin of the present invention which resin has a urethane bond in its molecule has (a2) the carboxyl group, the black photosensitive resin composition improves in solubility in a dilute alkaline aqueous developer for use in formation of a micropattern. Therefore, a micropattern can be formed by short-time development. In a case where the resin of the present invention which resin has a urethane bond in its molecule has (a3) the imide group, the black photosensitive resin composition improves in heat resistance and in electric insulation reliability under the high-temperature and high-humidity conditions. Therefore, a printed wiring board which is excellent in reliability can be obtained in a case where the black photosensitive resin composition is used as a covering material for the printed wiring board.

A resin which has (a1) the (meth)acryloyl group and has a urethane bond in its molecule can be obtained through any reaction. The resin which has (a1) the (meth)acryloyl group and has a urethane bond in its molecule is obtained by, for example, reacting not only the diol compound and the diisocyanate compound but also a compound which has a hydroxyl group and at least one (meth)acryloyl group and which is represented by the following general formula (4):

[Chem. 4]

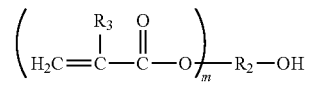

general formula (4)

wherein $R_2$ represents an organic group with a valency of (m+1), $R_3$ represents hydrogen or an alkyl group, and m is an integer of 1 to 3; and/or a compound which has an isocyanate group and at least one (meth)acryloyl group and which is represented by the following general formula (5):

[Chem. 5]

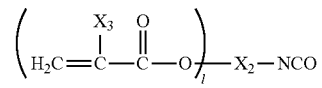

general formula (5)

wherein $X_2$ represents an organic group with a valency of (l+1), $X_3$ represents hydrogen or an alkyl group, and l is an integer of 1 to 3.

A compound of the present invention which compound has a hydroxyl group and at least one (meth)acryloyl group is not particularly limited provided that the compound has a structure represented by the general formula (4). For example, the compound of the present invention which compound has a hydroxyl group and at least one (meth)acryloyl group is exemplified by 2-hydroxyethyl(meth)acrylate, 2-hydroxypropyl(meth)acrylate, 2-hydroxybutyl(meth)acrylate, 2-hydroxy-3-phenoxypropyl(meth)acrylate, 2-hydroxy-1-acryloxy-3-methacryloxypropane, o-phenylphenol glycidyl ether (meth)acrylate, polyethylene glycol mono(meth)acrylate, pentaerythritol tri(meth)acrylate, tris (2-hydroxyethyl) isocyanurate di(meth)acrylate, 1,4-cyclohexanedimethanol mono(meth)acrylate, 4-hydroxyphenyl (meth)acrylate, 2-(4-hydroxyphenyl)ethyl(meth)acrylate, N-methylol acrylamide, 3,5-dimethyl-4-hydroxybenzyl acrylamide, and the like. These compounds can be used alone or in combination of two or more kinds.

A compound of the present invention which compound has an isocyanate group and at least one (meth)acryloyl group is not particularly limited provided that the compound has a structure represented by the general formula (5). For example, the compound of the present invention which compound has an isocyanate group and at least one (meth) acryloyl group is exemplified by 2-(meth)acryloyloxyethyl isocyanate, 1,1-(bisacryloyloxymethyl)ethyl isocyanate, 2-(2-methacryloyloxyethyloxyl)ethyl isocyanate, and the like. These compounds can be used alone or in combination of two or more kinds.

A resin which has (a2) the carboxyl group and has a urethane bond in its molecule can be obtained through any reaction. The resin which has (a2) the carboxyl group and has a urethane bond in its molecule is obtained by, for example, reacting not only the diol compound and the diisocyanate compound but also a compound which has two hydroxyl groups and one carboxyl group and which is represented by the following general formula (6):

[Chem. 6]

general formula (6)

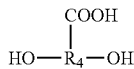

wherein $R_4$ represents a trivalent organic group.

A compound of the present invention which compound has two hydroxyl groups and one carboxyl group is not particularly limited provided that the compound has a structure represented by the general formula (6). For example, the compound of the present invention which compound has two hydroxyl groups and one carboxyl group is exemplified by 2,2-bis(hydroxymethyl)propionate, 2,2-bis(hydroxyethyl)propionate, 2,2-bis(3-hydroxypropyl)propionate, 2,3-dihydroxy-2-methylpropionate, 2,2-bis(hydroxymethyl)butanoic acid, 2,2-bis(2-hydroxyethyl)butanoic acid, 2,2-bis (3-hydroxypropyl)butanoic acid, 2,3-dihydroxybutanoic acid, 2,4-dihydroxy-3,3-dimethylbutanoic acid, 2,3-dihydroxyhexadecanoic acid, 2,3-dihydroxybenzoic acid, 2,4-dihydroxybenzoic acid, 2,5-dihydroxybenzoic acid, 2,6-dihydroxybenzoic acid, 3,4-dihydroxybenzoic acid, 3,5-dihydroxybenzoic acid, and the like. These compounds can be used alone or in combination of two or more kinds.

In particular, it is preferable to use, as the compound of the present invention which compound has two hydroxyl groups and one carboxyl group, an aliphatic compound which has two hydroxyl groups and one carboxyl group. This is because the aliphatic compound allows the black photosensitive resin composition to be excellent in photosensitivity.

A resin which has (a3) the imide group and a urethane bond in its molecule can be obtained through any reaction. The resin which has (a3) the imide group and has a urethane bond in its molecule is obtained by, for example, reacting not only the diol compound and the diisocyanate compound but also a tetracarboxylic dianhydride which is represented by the following general formula (7):

[Chem. 7]

general formula (7)

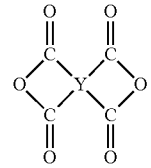

wherein Y represents a quadrivalent organic group.

The tetracarboxylic dianhydride of the present invention is not particularly limited provided that the tetracarboxylic dianhydride has a structure represented by the general formula (7). For example, the tetracarboxylic dianhydride is exemplified by tetracarboxylic dianhydrides such as 3,3',4, 4'-benzophenone tetracarboxylic dianhydride, pyromellitic dianhydride, 3,3',4,4'-oxydiphthalic dianhydride, 2,2-bis[4-(3,4-dicarboxyphenoxyl)phenyl]propane dianhydride, 2,2-bis(4-hydroxyphenyl)propane dibenzoate-3,3',4,4'-tetracarboxylic dianhydride, 3,3',4,4'-diphenylsulfonetetracarboxylic dianhydride, 3,3',4,4'-biphenyl tetracarboxylic dianhydride, 2,3,3',4-biphenyl tetracarboxylic dianhydride, 5-(2,5-dioxotetrahydro-3-furanyl)-3-methyl-3-cyclohexene-1,2-dicarboxylic dianhydride, and the like. These tetracarboxylic dianhydrides can be used alone or in combination of two or more kinds.

Poly(meth)acrylic resin of the present invention is a polymer which is soluble in an organic solvent, which has a repeating unit obtained by copolymerizing (meth)acrylic acid and/or an (meth)acrylic acid ester derivative, and which has a weight average molecular weight of not less than 1,000 and not more than 1,000,000 based on polyethylene glycol. Note here that (meth)acrylic means methacrylic and/or acrylic.

The poly(meth)acrylic resin of the present invention can be obtained through any reaction, e.g., by reacting the (meth)acrylic acid and/or the (meth)acrylic acid ester derivative in a solvent in the presence of a radical polymerization initiator.

For example, the (meth)acrylic acid ester derivative of the present invention is exemplified by, but not particularly limited to methyl (meth)acrylate, ethyl (meth)acrylate, propyl (meth)acrylate, butyl (meth)acrylate, isobutyl (meth)acrylate, t-butyl (meth)acrylate, hexyl (meth)acrylate, 2-ethylhexyl (meth)acrylate, octyl (meth)acrylate, nonyl (meth) acrylate, decyl (meth)acrylate, dodecyl (meth)acrylate, stearyl (meth)acrylate, benzil (meth)acrylate, and the like. These (meth)acrylic acid ester derivatives can be used alone or in combination of two or more kinds. From the viewpoint of flexibility and chemical resistance of a cured film of the black photosensitive resin composition, it is preferable to use particularly methyl (meth)acrylate, ethyl (meth)acrylate, or butyl (meth)acrylate of the (meth)acrylic acid ester derivatives.

For example, the radical polymerization initiator is exemplified by azo compounds such as azobisisobutyronitrile, azobis(2-methylbutyronitrile), 2,2'-azobis-2,4-dimethylvaleronitrile, and the like; organic peroxides such as t-butylhydroperoxide, cumene hydroperoxide, benzoyl peroxide, dicumyl peroxide, di-t-butyl peroxide, and the like; persulfates such as potassium persulfate, sodium persulfate, ammonium persulfate, and the like; hydrogen peroxide; and the like. These radical polymerization initiators can be used alone or in combination of two or more kinds.

The radical polymerization initiator is used in an amount preferably of not less than 0.001 part by weight and not more than 5 parts by weight, and more preferably of not less than 0.01 part by weight and not more than 1 part by weight, with respect to 100 parts by weight of monomers to be used. The radical polymerization initiator which is used in an amount of less than 0.001 part by weight prevents the reaction from progressing easily. The radical polymerization initiator which is used in an amount of more than 5 parts by weight may cause a reduction in molecular weight of the monomers.

It is preferable that an amount in which a solvent is used for a reaction of synthesis of the poly(meth)acrylic resin be set so that a reaction solution has a solute weight concentration, i.e., a solution concentration of not less than 5 wt % and not more than 90 wt %, and more preferably of not less than 20 wt % and not more than 70 wt %. The reaction solution which has a solution concentration of less than 5 wt % may prevent a polymerization reaction from being easily initiated and causes a reaction rate to be slow, whereby a desired structured material would not be obtained. The reaction solution which has a solution concentration of more than 90 wt % causes the reaction solution to have high viscosity and may prevent the reaction from occurring uniformly.

The poly(meth)acrylic resin is synthesized at a reaction temperature preferably of not less than 20° C. and not more than 120° C., and more preferably of not less than 50° C. and not more than 100° C. The reaction temperature of less than 20° C. causes a reaction time to be too long, and the reaction temperature of more than 120° C. may cause abrupt progress of the reaction and/or gelatinization due to three-dimensional crosslinking caused by a side reaction. A reaction time of the synthesis of the poly(meth)acrylic resin can be appropriately selected in accordance with a batch scale or a reaction condition to be employed.

<(B) Thermosetting Resin>

(B) The thermosetting resin of the present invention is a compound having a structure which has at least one thermosetting organic group in its molecule.

The (B) component of the present invention is not particularly limited provided that the (B) component has the above structure. For example, the (B) component is exemplified by epoxy resin, oxetane resin, phenol resin, isocyanate resin, block isocyanate resin, bismaleimide resin, bisallyl-nadi-imide resin, polyester resin (e.g., unsaturated polyester resin and the like), diallyl phthalate resin, silicon resin, vinylester resin, melamine resin, polybismaleimide triazine resin (BT resin), cyanate resin (e.g., cyanate ester resin and the like), urea resin, guanamine resin, sulfoamide resin, aniline resin, polyurea resin, thiourethane resin, polyazomethine resin, episulfide resin, en-thiol resin, benzoxazine resin, copolymer resins of these resins, modified resins obtained by modifying these resins, mixtures of these resins or mixtures of these resins and the other resins, and the like.

It is preferable to use, as the (B) component of the present invention, particularly polyfunctional epoxy resin of the above thermosetting resins. This is because the polyfunctional epoxy resin allows a cured film obtainable by curing the black photosensitive resin composition to have (i) heat resistance and (ii) adhesiveness to a conductor such as metal foil and to a circuit board.

The polyfunctional epoxy resin is a compound which has at least two epoxy groups in its molecule. For example, the polyfunctional epoxy resin is exemplified by bisphenol-A epoxy resin, bisphenol-F epoxy resin, bisphenol-S epoxy resin, hydrogenated bisphenol-A epoxy resin, biphenyl epoxy resin, phenoxy epoxy resin, naphthalene epoxy resin, phenol novolac epoxy resin, cresol novolac epoxy resin, trisphenol methane epoxy resin, dicyclopentadiene epoxy resin, amine epoxy resin, flexible epoxy resin, urethane-modified epoxy resin, rubber-modified epoxy resin, chelate-modified epoxy resin, and heterocycle-containing epoxy resin.

Specifically, the bisphenol-A epoxy resin is exemplified by jER828, jER1001, and jER1002 (trade names) manufactured by Japan Epoxy Resins Co. Ltd.; ADEKA RESIN EP-4100E and ADEKA RESIN EP-4300E (trade names) manufactured by ADEKA CORPORATION; RE-310S and RE-410S (trade names) manufactured by Nippon Kayaku Co., Ltd.; EPICLON 840S, EPICLON 850S, EPICLON 1050, and EPICLON 7050 (trade names) manufactured by DIC Corporation; and Epo Tohto YD-115, Epo Tohto YD-127, and Epo Tohto YD-128 (trade names) manufactured by Tohto Kasei Co., Ltd. The bisphenol-F epoxy resin is exemplified by jER806 and jER807 (trade names) manufactured by Japan Epoxy Resins Co. Ltd.; ADEKA RESIN EP-4901E, ADEKA RESIN EP-4930, and ADEKA RESIN EP-4950 (trade names) manufactured by ADEKA CORPORATION; RE-3035, RE-3045, RE-4035, and RE-4045 (trade names) manufactured by Nippon Kayaku Co., Ltd.; EPICLON 830 and EPICLON 835 (trade names) manufactured by DIC Corporation; and Epo Tohto YDF-170, Epo Tohto YDF-1755, and Epo Tohto YDF-2001 (trade names) manufactured by Tohto Kasei Co., Ltd. The bisphenol-S epoxy resin is exemplified by EPICLON EXA-1514 (trade name) manufactured by DIC Corporation. The hydrogenated bisphenol-A epoxy resin is exemplified by jERYX8000, jERYX8034, and jERYL7170 (trade names) manufactured by Japan Epoxy Resins Co. Ltd.; ADEKA RESIN EP-4080E (trade name) manufactured by ADEKA CORPORATION; EPICLON EXA-7015 (trade name) manufactured by DIC Corporation; and Epo Tohto YD-3000 and Epo Tohto YD-4000D (trade names) manufactured by Tohto Kasei Co., Ltd. The biphenyl epoxy resin is exemplified by jERYX4000, jERYL6121H, jERYL6640, and jERYL6677 (trade names) manufactured by Japan Epoxy Resins Co. Ltd.; and NC-3000 and NC-3000H (trade names) manufactured by Nippon Kayaku Co., Ltd. The phenoxy epoxy resin is exemplified by jER1256, jER4250, and jER4275 (trade names) manufactured by Japan Epoxy Resins Co. Ltd. The naphthalene epoxy resin is exemplified by EPICLON HP-4032, EPICLON HP-4700, and EPICLON HP-4200 (trade names) manufactured by DIC Corporation; and NC-7000L (trade name) manufactured by Nippon Kayaku Co., Ltd. The phenol novolac epoxy resin is exemplified by jER152 and jER154 (trade names) manufactured by Japan Epoxy Resins Co. Ltd.; EPPN-201-L (trade name) manufactured by Nippon Kayaku Co., Ltd.; EPICLON N-740 and EPICLON N-770 (trade names) manufactured by DIC Corporation; and Epo Tohto YDPN-638 (trade name) manufactured by Tohto Kasei Co., Ltd. The cresol novolac epoxy resin is exemplified by EOCN-1020, EOCN-102S, EOCN-103S, and EOCN-104S (trade names) manufactured by Nippon Kayaku Co., Ltd.; and EPICLON N-660, EPICLON N-670, EPICLON N-680, and EPICLON N-695 (trade names) manufactured by DIC Corporation. The trisphenol methane epoxy resin is exemplified by EPPN-501H, EPPN-501HY, and EPPN-502H (trade names) manufactured by Nippon Kayaku Co., Ltd. The dicyclopentadiene epoxy resin is exemplified by XD-1000 (trade name) manufactured by Nippon Kayaku Co., Ltd.; and EPICLON HP-7200 (trade name) manufactured by DIC Corporation. The amine epoxy resin is exemplified by jER604 and jER630 (trade names) manufactured by Japan Epoxy Resins Co. Ltd.; Epo Tohto YH-434 and Epo Tohto YH-434L (trade names) manufactured by Tohto Kasei Co., Ltd.; and TETRAD-X and TERRAD-C (trade names) manufactured by MITSUBISHI GAS CHEMICAL COMPANY, INC. The flexible epoxy resin is exemplified by jER871, jER872, jERYL7175, and jERYL7217 (trade names) manufactured by Japan Epoxy Resins Co. Ltd.; and EPICLON EXA-4850 (trade name) manufactured by DIC Corporation. The urethane-modified epoxy resin is exemplified by ADEKA RESIN EPU-6, ADEKA RESIN EPU-73, and ADEKA RESIN EPU-78-11 (trade names) manufactured by ADEKA CORPORATION. The rubber-modified epoxy resin is exemplified by ADEKA RESIN EPR-4023, ADEKA RESIN EPR-4026, and ADEKA RESIN EPR-1309 (trade names) manufactured by ADEKA CORPORATION. The chelate-modified epoxy resin is exemplified by ADEKA RESIN EP-49-10 and ADEKA RESIN EP-49-20 (trade names) manufactured by ADEKA CORPORATION; and the like. The heterocycle-containing epoxy resin is exemplified by TEPIC (trade name) manufactured by NISSAN CHEMICAL INDUSTRIES, LTD. (triglycidyl isocyanurate).

For example, a curing agent to be used for the thermosetting resin contained in the black photosensitive resin composition of the present invention is exemplified by, but not particularly limited to phenol resins such as phenol novolac resin, cresol novolac resin, naphthalene phenol resin, and the like; amino resin; urea resin; melamine; dicyandiamide; and the like. These curing agents can be used alone or in combination of two or more kinds.

For example, a curing accelerator to be used for the thermosetting resin contained in the black photosensitive resin composition of the present invention is exemplified by, but not particularly limited to phosphine compounds such as triphenylphosphine and the like; amine compounds such as a tertiary amine, trimethanolamine, triethanolamine, tetraethanolamine, and the like; borate compounds such as 1,8-diaza-bicyclo[5,4,0]-7-undecenium tetraphenyl borate and the like; imidazoles such as imidazole, 2-ethylimidazole, 2-ethyl-4-methylimidazole, 2-phenylimidazole, 2-undecylimidazole, 1-benzyl-2-methylimidazole, 2-heptadecylimidazole, 2-isopropylimidazole, 2,4-dimethylimidazole, 2-phenyl-4-methylimidazole, and the like; imidazolines such as 2-methylimidazoline, 2-ethylimidazoline, 2-isopropylimidazoline, 2-phenylimidazoline, 2-undecylimidazoline, 2,4-dimethylimidazoline, 2-phenyl-4-methylimidazoline, and the like; azine imidazoles such as 2,4-diamino-6-[2'-methylimidazolyl-(1')]-ethyl-s-triazine, 2,4-diamino-6-[2'-undecylimidazolyl-(1')]-ethyl-s-triazine, 2,4-diamino-6-[2'-ethyl-4'-methylimidazolyl-(1')]-ethyl-s-triazine, and the like; and the like. These curing accelerators can be used alone or in combination of two or more kinds.

It is only necessary that the (B) component of the present invention be contained in an amount preferably of not less than 1 part by weight and not more than 100 parts by weight, and more preferably of not less than 5 parts by weight and not more than 50 parts by weight, with respect to 100 parts by weight of the (A) component. This allows a cured film obtainable by curing the black photosensitive resin composition to be excellent in electric insulation reliability, heat resistance, and bending resistance. The (B) component which is contained in an amount of less than 1 part by weight may cause the cured film to be inferior in electric insulation reliability and heat resistance, and the (B) component which is contained in an amount of more than 100 parts by weight may cause the cured film to be inferior in bending resistance.

<(C) Flame Retardant which is Substantially Insoluble in Organic Solvent>

(C) The flame retardant of the present invention which flame retardant is substantially insoluble in an organic solvent is a compound which is insoluble in an organic solvent, which is present in a form of a solid at a room temperature (23° C.), and which has an effect of preventing an organic matter from burning. The organic solvent herein refers to an organic solvent serving as the (F) component of the present invention. Accordingly, (C) the flame retardant of the present invention which flame retardant is substantially insoluble in an organic solvent refers to a flame retardant which is substantially insoluble in the (F) component contained in the black photosensitive resin composition of the present invention.

Note here that "substantially insoluble in an organic solvent" means "totally insoluble in an organic solvent" or "may be soluble within the scope in which an effect of the present invention appears without fail". "The scope in which an effect of the present invention appears without fail" means that the (C) component which is dissolved in 100 parts by weight of an organic solvent at a room temperature (23° C.) has a weight of less than 0.1 part by weight. Accordingly, (C) the flame retardant which is substantially insoluble in an organic solvent refers to a flame retardant which is dissolved in 100 parts by weight of an organic solvent at a room temperature in an amount of less than 0.1 part by weight. Further, for example, the organic solvent is exemplified by, but not particularly limited to the organic solvents mentioned earlier.

For example, a method for measuring parts by weight of the (C) component which is dissolved in 100 parts by weight of an organic solvent is exemplified by, but not particularly limited to a method in which 1 part by weight of the (C) component is added to 100 parts by weight of an organic solvent; a resultant mixture is stirred at 40° C. for 1 hour, cooled to a room temperature (23° C.), and left to stand for not less than 24 hours; vacuum filtration is carried out by use of a PTFE membrane filter having a pore size of 0.45 µm; the filter is rinsed three times with the organic solvent used, and dried at 60° C. at reduced pressure for 8 hours; and then a change in weight of the filter is measured.

Assume that the (C) component of the present invention is at least one kind selected from the group consisting particularly of (c1) the phosphorus compound, (c2) the melamine compound, and (c3) the metal hydroxide. Such a case is preferable because the at least one kind thus selected allows a cured film obtainable by curing the black photosensitive resin composition to improve in flame retardancy, decrease in outgassing, be excellent in electric insulation reliability, and be low in warpage.

(c1) The phosphorus compound is not particularly limited provided that (c1) the phosphorus compound is a compound which is substantially insoluble in an organic solvent and contains elemental phosphorus. For example, (c1) the phosphorus compound is exemplified by aluminum tris(diethylphosphinate), aluminum tris(methylethylphosphinate), aluminum tris(diphenylphosphinate), zinc bis(diethylphosphinate), zinc bis(methylethylphosphinate), zinc bis(diphenylphosphinate), titanyl bis(diethylphosphinate), titanyl bis(methylethylphosphinate), titanyl bis(diphenylphosphinate), and melamine polyphosphate. These phosphorus compounds can be used alone or in combination of two or more kinds.

(c2) The melamine compound is not particularly limited provided that (c2) the melamine compound is a compound which is substantially insoluble in an organic solvent and has a melamine structure. For example, (c2) the melamine compound is exemplified by melamine polyphosphate, melamine cyanurate, a nitrilotrismethylene phosphonic acid melamine adduct, and a melamine oligomeric condensate. These melamine compounds can be used alone or in combination of two or more kinds.

(c3) The metal hydroxide is not particularly limited provided that (c3) the metal hydroxide is a compound which is substantially insoluble in an organic solvent and contains crystallization water. For example, (c3) the metal hydroxide is exemplified by aluminum hydroxide, magnesium hydroxide, zirconium hydroxide, zinc hexahydroxystannate, zinc borate hemiheptahydrate, and calcium aluminate hydrate. These metal hydroxides can be used alone or in combination of two or more kinds.

It is only necessary that the (C) component of the present invention be contained in an amount preferably of not less than 5 parts by weight and not more than 100 parts by weight, and more preferably of not less than 10 parts by weight and not more than 50 parts by weight, with respect to 100 parts by weight of the (A) component. This allows a cured film obtainable by curing the black photosensitive resin composition to be excellent in flame retardancy and electric insulation reliability. The (C) component which is contained in an amount of less than 5 parts by weight may cause the cured film to be inferior in flame retardancy. The (C) component which is contained in an amount of more than 100 parts by weight (i) may cause the cured film to be inferior in bending resistance, and (ii) may cause the cured film to be poor in appearance due to foaming and insufficient leveling of a coating film during coating because a solution of the black photosensitive resin composition is poor in coatability during coating of the solution of the black photosensitive resin composition.

<(D) Photopolymerization Initiator>

(D) The photopolymerization initiator is a compound which is activated by energy such as UV so as to initiate and promote a reaction of a radical polymerizable group.

The (D) component of the present invention is not particularly limited provided that the (D) component is a compound which has the above function. For example, the (D) component is exemplified by Michler's ketone, 4,4'-bis (diethylamino)benzophenone, 4,4',4''-tris(dimethylamino) triphenylmethane, 2,2'-bis(2-chlorophenyl)-4,4',5,5'-tetraphenyl-1,2'-diimidazole, acetophenone, benzoin, 2-methylbenzoin, benzoin methyl ether, benzoin ethyl ether, benzoin isopropyl ether, benzoin isobutyl ether, 2-t-butyl anthraquinone, 1,2-benzo-9,10-anthraquinone, methyl anthraquinone, thioxanthone, 2,4-diethylthioxanthone, 2-isopropylthioxanthone, 1-hydroxy cyclohexyl phenyl ketone, diacetyl benzyl, benzyl dimethyl ketal, benzyl diethyl ketal, 2-(2'-furyl ethylidene)-4,6-bis(trichloromethyl)-S-triazine, 2-[2'-(5''-methyl furyl)ethylidene]-4,6-bis (trichloromethyl)-S-triazine, 2-(p-methoxyphenyl)-4,6-bis (trichloromethyl)-S-triazine, 2,6-di(p-azidobenzal)-4-methyl cyclohexanone, 4,4'-diazido chalcone, di(tetraalkylammonium)-4,4'-diazido stilbene-2,2'-disulfonate, 2,2-dimethoxy-1,2-diphenylethane-1-on, 1-hydroxycyclohexyl-phenyl-ketone, 2-hydroxy-2-methyl-1-phenyl-propane-1-on, 1-[4-(2-hydroxy ethoxy)-phenyl]-2-hydroxy-2-methyl-1-propane-1-on, 2-methyl-1-[4-(methylthio) phenyl]-2-morpholinopropane-1-on, 2-benzyl-2-dimethylamino-1-(4-morpholinophenyl)-butane-1-on, bis(2, 4,6-trimethylbenzoyl)-phenylphosphine oxide, bis(2,6-dimethoxybenzoyl)-2,4,4-trimethyl-pentylphosphine oxide, 2,4,6-trimethylbenzoyl-diphenyl-phosphine oxide, 2-hydroxy-2-methyl-1-phenyl-propane-1-ketone, bis(n-5,2,4-cyclopentadiene-1-yl)-bis(2,6-difluoro-3-(1H-pyrrole-1-yl)-phenyl) titanium, 1,2-octanedione, 1-[4-(phenylthio)-2-(O-benzoyl oxime)], iodonium, (4-methylphenyl)[4-(2-methyl propyl)phenyl]-hexafluorophosphate(1-), ethyl-4-dimethylamino benzoate, 2-ethylhexyl-4-dimethylamino benzoate, ethanone, 1-[9-ethyl-6-(2-methylbenzoyl)-9H-carbazole-3-yl]-1-(O-acetyl oxime), 4,4'-bis(dimethylamino)benzophenone, 2-benzyl-2-dimethylamino-1-(4-morpholinophenyl)-butanone-1, and the like. These compounds can be used alone or in combination of two or more kinds.

In order to enhance photosensitivity, sensitivity, and resolution of the black photosensitive resin composition, it is preferable to use, as the (D) component of the present invention, particularly an oxime ester photopolymerization initiator such as 1,2-octanedione, 1-[4-(phenylthio)-2-(O-benzoyl oxime)], ethanone, or 1-[9-ethyl-6-(2-methylbenzoyl)-9H-carbazole-3-yl]-1-(O-acetyl oxime) of the above photopolymerization initiators.

It is only necessary that the (D) component of the present invention be contained in an amount preferably of not less than 0.1 part by weight and not more than 10 parts by weight, and more preferably of not less than 0.5 part by weight and not more than 10 parts by weight, with respect to 100 parts by weight of the (A) component. This makes it possible to obtain the black photosensitive resin composition which is excellent in photosensitivity and in which outgassing occurs in a smaller amount. The (D) component which is contained in an amount of less than 0.1 part by weight may cause the black photosensitive resin composition to be inferior in photosensitivity, and the (D) component which is contained in an amount of more than 10 parts by weight may cause outgassing in a large amount in the black photosensitive resin composition.

<(E) Black Colorant which Reflects Light Having a Wavelength Falling within an Infrared Range>

(E) The black colorant of the present invention which black colorant reflects light having a wavelength falling within an infrared range refers to a black colorant which is a substance such as a black dye, a black pigment, or the like that has an effect of coloring another substance black, and which has a reflectance of not less than 5% in a wavelength region of 800 nm to 2000 nm which wavelength region is an infrared region of the present invention. For example, a method for measuring a reflectance in the present invention is exemplified by, but not particularly limited to a method in which a measurement sample is poured into a cell so as to be measured by use of JASCO's spectrophotometer U-4100.

For example, the black pigment which reflects light having a wavelength falling within an infrared range is exemplified by, but not particularly limited to metal complex oxides such as iron-manganese complex oxide, iron-cobalt-chromium complex oxide, iron-chromium-manganese complex oxide, copper-chromium complex oxide, copper-chromium-manganese complex oxide, and the like. For example, the black pigment which reflects light having a wavelength falling within an infrared range is specifically exemplified by AB820 Black and AG235 Black (trade names) manufactured by KAWAMURA CHEMICAL CO., LTD.; and Black 6350, Black 6301, Black 6302, and Black 6303 (trade names) manufactured by ASAHI KAGAKU KOGYO CO., LTD. The black colorant is exemplified by organic pigments such as an aniline compound, an anthraquinone compound, a perylene compound, and the like. For example, the black colorant is specifically exemplified by Paliogen Black S0084, Lumogen Black FK4280, Lumogen Black FK4281, and the like (trade names) manufactured by BASF. These black colorants can be used alone or in combination of two or more kinds. Of the metal complex oxides, particularly a metal complex oxide containing iron, chromium, manganese, or bismuth is more preferable from the viewpoint of an insulation property. Of the organic pigments, a perylene compound is more preferable from the viewpoint of an insulation property.

It is only necessary that the (E) component of the present invention be contained in an amount preferably of not less than 0.1 part by weight and not more than 30 parts by weight, and more preferably of not less than 1 part by weight and not more than 30 parts by weight, with respect to 100 parts by weight of the (A) component. This allows a cured film obtainable by curing the black photosensitive resin composition to be excellent in blackness and coverability. The (E) component which is contained in an amount of less than 0.1 part by weight may cause the cured film to be inferior in blackness and coverability, and the (E) component which is contained in an amount of more than 30 parts by weight causes the black photosensitive resin composition to have a lower transmittance, so that the cured film may have a lower photosensitivity.

<(F) Organic Solvent>

(F) The organic solvent of the present invention is not particularly limited provided that (F) the organic solvent is an organic polar solvent. For example, (F) the organic solvent is exemplified by sulfoxide solvents such as dimethyl sulfoxide, diethyl sulfoxide, and the like; formamide solvents such as N,N-dimethylformamide, N,N-diethylformamide, and the like; acetamide solvents such as N,N-dimethyl acetamide, N,N-diethyl acetamide, and the like; pyrrolidone solvents such as N-methyl-2-pyrrolidone, N-vinyl-2-pyrrolidone, and the like; hexamethylphosphoramide; γ-butyrolactone; and the like. Further, according to need, it is possible to use, in combination, such an organic polar solvent as mentioned above and aromatic hydrocarbon such as xylene, toluene, or the like.

For example, (F) the organic solvent of the present invention is further exemplified by symmetric glycol diethers such as methylmonoglyme(1,2-dimethoxy ethane), methyldiglyme(bis(2-methoxy ethyl)ether), methyltriglyme (1,2-bis(2-methoxyethoxy)ethane), methyltetraglyme(bis[2-(2-methoxyethoxyethyl)]ether), ethylmonoglyme(1,2-diethoxyethane), ethyldiglyme(bis(2-ethoxyethyl)ether), butyldiglyme(bis(2-butoxyethyl)ether), and the like; acetates such as methyl acetate, ethyl acetate, isopropyl acetate, n-propyl acetate, butyl acetate, propylene glycol monomethyl ether acetate, ethylene glycol monobutyl ether acetate, diethylene glycol monoethyl ether acetate (another name: Carbitol acetate, 2-(2-butoxy ethoxy)ethyl) acetate, diethylene glycol monobutyl ether acetate, 3-methoxybutyl acetate, ethylene glycol monomethyl ether acetate, ethylene glycol monoethyl ether acetate, dipropylene glycol methyl ether acetate, propylene glycol diacetate, 1,3-butylene glycol diacetate, and the like; and ethers such as dipropylene glycol methyl ether, tripropylene glycol methyl ether, propylene glycol n-propyl ether, dipropylene glycol n-propyl ether, propylene glycol n-butyl ether, dipropylene glycol n-butyl ether, tripropylene glycol n-propyl ether, propylene glycol phenyl ether, dipropylene glycol dimethyl ether, 1,3-dioxolane, ethylene glycol monobutyl ether, diethylene glycol monoethyl ether, diethylene glycol monobutyl ether, ethylene glycol monoethyl ether, and the like.

It is only necessary that the (F) component of the present invention be contained in an amount preferably of not less than 10 parts by weight and not more than 500 parts by weight, and more preferably of not less than 50 parts by weight and not more than 300 parts by weight, with respect to 100 parts by weight of the (A) component. This makes it possible to obtain the black photosensitive resin composition which is excellent in printing property. The (F) component which is contained in an amount of less than 10 parts by weight may be associated with a problem such as foaming after printing, inferiority in leveling property, and unevenness of a film thickness, and the (F) component which is contained in an amount of more than 500 parts by weight may be associated with an insufficiency of a film thickness.

<(G) Spherical Organic Beads>

(G) The spherical organic beads of the present invention is a spherical polymer which contains carbon and includes an elliptical polymer.

For example, an average particle diameter of the (G) component of the present invention can be measured as a median diameter (a particle diameter with respect to a cumulative size distribution value of 50%) on a volumetric basis under the following measurement condition.

(Measurement Condition Under which Average Particle Diameter is Measured)

Device: counterpart of LA-950V2 manufactured by HORIBA, Ltd.

Measurement method: laser diffraction/scattering method

The average particle diameter of the (G) component of the present invention is not particularly limited, but is preferably not less than 3 µm and not more than 15 µm. This is because the (G) component which has an average particle diameter falling within the above range allows an insulating film obtainable from the black photosensitive resin composition to be excellent in flexibility and chemical resistance. In a case where the (G) component of the present invention has an average particle diameter of less than 3 µm, no unevenness is effectively formed on a surface of an insulating film obtainable from the black photosensitive resin composition, and the insulating film may be inferior in tack-free property. In a case where the (G) component of the present invention has an average particle diameter of more than 15 µm, particles are exposed on an opening of the black photosensitive resin composition during formation of a micropattern, so that the black photosensitive resin composition may be inferior in resolution.

It can be confirmed by any method that an insulating film obtainable from the black photosensitive resin composition contains the (G) component. For example, the method is exemplified by a method in which a flexible printed circuit board (FPC) including an insulating film obtainable from the black photosensitive resin composition is wrapped with a thermosetting resin, a cross section of the insulating film which cross section extends in a thickness direction is exposed by ion-beam polishing the cross section of the insulating film, and the cross section of the insulating film is observed by use of a scanning electron microscope (described below).

(Exposure of Cross Section of Insulating Film Obtainable from Black Photosensitive Resin Composition)

A part of an FPC which part has an area of 5 mm×3 mm is cut out with a cutter, and an epoxy embedding resin and cover glass are used to form a protective film layer and a cover glass layer on both sides of the part of the FPC which part has thus been cut out. Thereafter, ion-beam cross section polisher processing is carried out with respect to a cross section of an insulating film which cross section extends in a thickness direction.

(Cross Section Polisher Processing)
Used device: counterpart of SM-09020CP manufactured by JEOL Ltd.
Processing condition: acceleration voltage of 6 kV (Observation of Cross Section of Insulating Film)

The obtained cross section of the insulating film which cross section extends in the thickness direction is observed by use of a scanning electron microscope.

(Observation by Use of Scanning Electron Microscope)
Used device: counterpart of S-3000N manufactured by Hitachi High-Technologies Corporation
Observation condition: acceleration voltage of 15 kV
Detector: reflective electron detection (composition mode)
Magnification: 1000 magnifications According to the reflection electron detection (composition mode) used here, a difference in average atomic number in an observed region is clearly reflected in contrast. Therefore, a region in which a heavy element is present is observed to be bright (white), and a region in which a light element is present is observed to be dark (black). Accordingly, the (G) component, which is spherical and is an organic matter containing comparative light elements such as carbon, hydrogen, oxygen, nitrogen, and the like, is observed as a dark (black) circular region.

For example, the (G) component of the present invention is exemplified by, but not particularly limited to polymethylmethacrylate spherical organic beads, cross-linked polymethylmethacrylate spherical organic beads, cross-linked polybutylmethacrylate spherical organic beads, cross-linked acrylic spherical organic beads, acrylic copolymer spherical organic beads, cross-linked styrene spherical organic beads, cross-linked polyacrylic acid ester organic beads, nylon spherical organic beads, silicone spherical organic beads, cross-linked silicone spherical organic beads, cross-linked urethane spherical organic beads, and the like.

Specifically, the polymethylmethacrylate spherical organic beads is exemplified by Ganz Pearl GM-0600 and GM-0600W (trade names) manufactured by GANZ CHEMICAL CO., LTD. The cross-linked polymethylmethacrylate spherical organic beads is exemplified by Ganz Pearl GM-0401S, GM-0801S, GM-0807S, GM-1001-S, GM-10075, GM-1505-S, GMX-0610, GMX-0810, GMP-0800, GMDM-050M, GMDM-080M, GMDM-100M, GMDM-150M (trade names) manufactured by GANZ CHEMICAL CO., LTD.; and Techpolymer MBX-5, MBX-8, and MBX-12 (trade names) manufactured by SEKISUI PLASTICS CO., Ltd. The cross-linked polybutylmethacrylate spherical organic beads is exemplified by Ganz Pearl GB-055, GB-085, GB-10S, and GB-15S (trade names) manufactured by GANZ CHEMICAL CO., LTD.; and Techpolymer BM30X-5 and BM30X-8 (trade names) manufactured by SEKISUI PLASTICS CO., Ltd. The cross-linked acrylic spherical organic beads is exemplified by Ganz Pearl GMP-0820 (trade name) manufactured by GANZ CHEMICAL CO., LTD. The acrylic copolymer spherical organic beads is exemplified by Ganz Pearl GBM-55COS (trade name) manufactured by GANZ CHEMICAL CO., LTD. The cross-linked styrene spherical organic beads is exemplified by Ganz Pearl GS-0605 and GS-1105 (trade names) manufactured by GANZ CHEMICAL CO., LTD.; and Techpolymer SBX-6 and SBX-8 (trade names) manufactured by SEKISUI PLASTICS CO., Ltd. The cross-linked polyacrylic acid ester organic beads is exemplified by Techpolymer ABX-8, AF10X-8, AFX-15, and ARX-15 (trade names) manufactured by SEKISUI PLASTICS CO., Ltd. The nylon spherical organic beads is exemplified by Ganz Pearl GPA-550 (trade name) manufactured by GANZ CHEMICAL CO., LTD. The silicone spherical organic beads is exemplified by Ganz Pearl SI-020, SI-030, and SI-045 (trade names) manufactured by GANZ CHEMICAL CO., LTD. The cross-linked silicone spherical organic beads is exemplified by Ganz Pearl SIG-070 (trade name) manufactured by GANZ CHEMICAL CO., LTD. The cross-linked urethane spherical organic beads is exemplified by DAIMICBEAZ UCN-8070 CM Clear, UCN-8150 CM Clear, UCN-5070 D Clear, and UCN-5150 D Clear (trade names) manufactured by Dainichiseika Color & Chemicals Mfg. Co., Ltd.; and Art Pearl C-100 Transparent, C-200 Transparent, C-300 Transparent, C-300WA, C-400 Transparent, C-400WA, C-600 Transparent, C-800 Transparent, C-800WA, P-400T, P-800T, U-600T, CF-600T, JB-400T, JB-800T, CE-400T, and CE-800T (trade names) manufactured by Negami Chemical Industrial Co., Ltd. The above spherical organic beads can be used alone or in combination of two or more kinds as the (G) component.

Of the above spherical organic beads, particularly cross-linked spherical beads which has a urethane bond in its molecule is preferably used as the (G) component of the present invention so that an insulating film obtainable from the black photosensitive resin composition is low in warpage, improves in flexibility resistant to repeated bending, and has higher adhesiveness to the (A) component.

It is only necessary that the (G) component of the present invention be mixed in an amount preferably of not less than 30 parts by weight and not more than 100 parts by weight, and more preferably of not less than 40 parts by weight and not more than 80 parts by weight, with respect to 100 parts by weight of the (A) component. This makes it possible to effectively form unevenness on an insulating film obtainable from the black photosensitive resin composition, so that the insulating film is excellent in tack-free property. Moreover, obtainment of a filling effect yielded by the (G) component lowers the warpage of the insulating film obtainable from the black photosensitive resin composition and thus causes an increase in stress relaxation effect and fracture toughness, so that the insulating film improves in flexibility greatly enough to be resistant to repeated bending. The (G) component which is contained in an amount of less than 30 parts by weight may make it impossible to obtain flexibility great enough for the cured film to be resistant to repeated bending. The (G) component which is contained in an amount of more than 100 parts by weight may cause the cured film to be poor in appearance due to foaming and insufficient leveling of a coating film during coating because the cured film is poor in flame retardancy and in coatability of the resin composition during coating of the resin composition.

<Other Components>

According to need, the black photosensitive resin composition in accordance with the present invention can further contain various additives such as a radical polymerizable compound, a filler, an adhesive assistant, an antifoaming agent, a leveling agent, a polymerization inhibitor, a flame retardant other than (c) the flame retardant which is substantially insoluble in an organic solvent, and the like.

The radical polymerizable compound is a compound which has a radical polymerizable group whose polymerization reaction progresses by a radical polymerization initiator. Such a compound is more preferably resin which has, in its molecule, at least one unsaturated double bond as a radical polymerizable group. Further, the at least one unsaturated double bond is preferably a (meth)acryloyl group or a vinyl group.

The radical polymerizable compound is preferably used in a case where the (A) component has no (meth)acryloyl group. However, The radical polymerizable compound may also be used in a case where the (A) component has a (meth)acryloyl group.

For example, the radical polymerizable compound is exemplified by bisphenol F EO-modified (n=2 to 50) diacrylate, bisphenol-A EO-modified (n=2 to 50) diacrylate, bisphenol S EO-modified (n=2 to 50) diacrylate, bisphenol F EO-modified (n=2 to 50) dimethacrylate, bisphenol-A EO-modified (n=2 to 50) dimethacrylate, bisphenol S EO-modified (n=2 to 50) dimethacrylate, 1,6-hexanediol diacrylate, neopentyl glycol diacrylate, ethylene glycol diacrylate, pentaerythritol diacrylate, trimethylolpropane triacrylate, pentaerythritol triacrylate, dipentaerythritol hexaacrylate, tetramethylol propane tetraacrylate, tetraethylene glycol diacrylate, 1,6-hexanediol dimethacrylate, neopentyl glycol dimethacrylate, ethylene glycol dimethacrylate, pentaerythritol dimethacrylate, trimethylolpropane trimethacrylate, pentaerythritol trimethacrylate, dipentaerythritol hexamethacrylate, tetramethylol propane tetramethacrylate, tetraethylene glycol dimethacrylate, methoxy diethylene glycol methacrylate, methoxy polyethylene glycol methacrylate, β-methacryloyl oxyethyl hydrogen phthalate, β-methacryloyl oxyethyl hydrogen succinate, 3-chloro-2-hydroxypropyl methacrylate, stearyl methacrylate, phenoxyethyl acrylate, phenoxydiethylene glycol acrylate, phenoxypolyethylene glycol acrylate, β-acryloyl oxyethyl hydrogen succinate, lauryl acrylate, ethylene glycol dimethacrylate, diethylene glycol dimethacrylate, triethylene glycol dimethacrylate, polyethylene glycol dimethacrylate, 1,3-butylene glycol dimethacrylate, 1,6-hexanediol dimethacrylate, neopentyl glycol dimethacrylate, polypropylene glycol dimethacrylate, 2-hydroxy-1,3-dimethacryloxy propane, 2,2-bis[4-(methacryloxy ethoxy)phenyl]propane, 2,2-bis[4-(methacryloxy.diethoxy)phenyl]propane, 2,2-bis[4-(methacryloxy.polyethoxy)phenyl]propane, polyethylene glycol diacrylate, tripropylene glycol diacrylate, polypropylene glycol diacrylate, 2,2-bis[4-(acryloxy.diethoxy)phenyl]propane, 2,2-bis[4-(acryloxy.polyethoxy)phenyl]propane, 2-hydroxy-1-acryloxy-3-methacryloxy propane, trimethylol propane trimethacrylate, tetramethylol methane triacrylate, tetramethylol methane tetraacrylate, methoxy dipropylene glycol methacrylate, methoxy triethylene glycol acrylate, nonyl phenoxypolyethylene glycol acrylate, nonyl phenoxypolypropylene glycol acrylate, 1-acryloyl oxypropyl-2-phthalate, isostearyl acrylate, polyoxyethylene alkyl ether acrylate, nonyl phenoxyethylene glycol acrylate, polypropylene glycol dimethacrylate, 1,4-butanediol dimethacrylate, 3-methyl-1,5-pentanediol dimethacrylate, 1,6-hexandiol dimethacrylate, 1,9-nonanediol dimethacrylate, 2,4-diethyl-1,5-pentanediol dimethacrylate, 1,4-cyclohexanedimethanol dimethacrylate, dipropylene glycol diacrylate, tricyclodecane dimethanol diacrylate, 2,2-hydrogenated bis[4-(acryloxy.polyethoxy)phenyl]propane, 2,2-bis[4-(acryloxy.polypropoxy)phenyl]propane, 2,4-diethyl-1,5-pentanediol diacrylate, ethoxylated trimethylolpropane triacrylate, propoxylated trimethylolpropane triacrylate, isocyanurate tri(ethane acrylate), pentaerythritol tetraacrylate, ethoxylated pentaerythritol tetraacrylate, propoxylated pentaerythritol tetraacrylate, ditrimethylolpropane tetraacrylate, dipentaerythritol polyacrylate, triallyl isocyanurate, glycidyl methacrylate, glycidyl allyl ether, 1,3,5-triacryloyl hexahydro-s-triazine, triallyl 1,3,5-benzene carboxylate, triallylamine, triallyl citrate, triallyl phosphate, allobarbital, diallylamine, diallyl dimethyl silane, diallyl disulfide, diallyl ether, diallyl sialate, diallyl isophthalate, diallyl terephthalate, 1,3-diallyloxy-2-propanol, diallyl sulfide diallyl maleate, 4,4'-isopropylidene diphenol dimethacrylate, 4,4'-isopropylidene diphenol diacrylate, and the like. These radical polymerizable compounds can be used alone or in combination of two or more kinds. It is preferable to use, as the radical polymerizable compound, particularly a radical polymerizable compound in which EO (ethylene oxide) contained in one molecule of diacrylate or dimethacrylate has 2 to 50 mole repeating units. This is because such a radical polymerizable compound allows (i) higher solubility of the black photosensitive resin composition in an aqueous developer typified by an alkaline aqueous solution and (ii) a shorter development time.

For example, the filler is exemplified by fine (particulate) inorganic fillers such as silica, mica, talc, barium sulfate, wollastonite, calcium carbonate, and the like.

For example, the adhesive assistant (also referred to as an adhesive improver) is exemplified by a silane coupling agent, a triazole compound, a tetrazole compound, a triazine compound, and the like.

For example, the antifoaming agent is exemplified by an acrylic compound, a vinyl compound, a butadiene compound, and the like.

For example, the leveling agent is exemplified by an acrylic compound, a vinyl compound, and the like.

For example, the polymerization inhibitor is exemplified by hydroquinone, hydroquinone monomethyl ether, and the like.

For example, the flame retardant other than (c) the flame retardant which is substantially insoluble in an organic solvent (hereinafter referred to as an additional flame retardant) is exemplified by a phosphoric ester compound, a halogen-containing compound, a metal hydroxide, an organic phosphorus compound, a silicone compound, and the like. For example, the additional flame retardant can be used as an additive flame retardant or a reactive flame retardant. The above additional flame retardants may be appropriately used alone or in combination of two or more kinds.

Of these additional flame retardants, from the viewpoint of environmental contamination, it is more preferable to use a non-halogen compound, and it is particularly preferable to use a phosphorous flame retardant.

<Method for Preparing Black Photosensitive Resin Composition>

The black photosensitive resin composition in accordance with the present invention can be obtained by mixing the (A) to (G) components and the other components by pulverizing and dispersing these components. A method for pulverizing and dispersing the components is not particularly limited. For example, the components are pulverized and dispersed by use of a general kneading device such as a beads-mill device, a ball-mill device, a three-roll device, or the like. A particle diameter of particles contained in the black photosensitive resin composition can be measured by use of a gauge which is defined by JIS K 5600-2-5. Further, it is possible to measure, by use of a particle size distribution measuring device, an average particle diameter, a particle diameter, and a particle size distribution of the particles contained in the black photosensitive resin composition.

<Method for Using Black Photosensitive Resin Composition>

A cured film or a relief pattern can be formed as below by directly using the black photosensitive resin composition in accordance with the present invention, or after a solution of the black photosensitive resin composition is prepared. First, the black photosensitive resin composition or the solution of the black photosensitive resin composition is applied to a substrate. Then, the black photosensitive resin composition is dried so that a solvent is removed therefrom. The black photosensitive resin composition or the solution of the black photosensitive resin composition can be applied to the substrate by screen printing, curtain roll coating, reverse roll coating, spray coating, spin coating by use of a spinner, or the like. A coating film (having a thickness preferably of not less than 5 μm and not more than 100 μm, and particularly preferably of not less than 10 μm and not more than 100 μm) is dried at a temperature of not more than 120° C., and preferably of not less than 40° C. and not more than 100° C.

Subsequently, after the coating film is dried, a negative photolithographic mask is provided on the dried coating film, and the film is irradiated with an activate light ray such as ultraviolet light, a visible light ray, an electron ray, or the like. Then, a relief pattern can be obtained by rinsing an unexposed part of the film with a developer by use of various methods such as a spray, a shower, a paddle, immersion, ultrasonic waves, and the like. Note that it is desirable to appropriately find an optimum device condition since a time which is required for exposure of a pattern varies depending on a spray pressure and a flow rate of a developing device, a temperature of an etchant, and the like.

It is preferable to use an alkaline aqueous solution as the developer. The developer may contain a water-soluble organic solvent such as methanol, ethanol, n-propanol, isopropanol, N-methyl-2-pyrrolidone, or the like. For example, an alkaline compound which constitutes the alkaline aqueous solution is exemplified by a hydroxide, a carbonate, and a hydrogencarbonate of an alkali metal, an alkali earth metal, or an ammonium ion; an amine compound; and the like. For example, the alkaline compound is specifically exemplified by sodium hydroxide, potassium hydroxide, ammonium hydroxide, sodium carbonate, potassium carbonate, ammonium carbonate, sodium hydrogen carbonate, potassium hydrogen carbonate, ammonium hydrogen carbonate, tetramethylammonium hydroxyde, tetraethylammonium hydroxyde, tetrapropylammonium hydroxyde, tetraisopropylammonium hydroxyde, N-methyl diethanolamine, N-ethyl diethanolamine, N,N-dimethyl ethanolamine, triethanolamine, triisopropanolamine, triisopropylamine, and the like. As a matter of course, it is also possible to use a compound other than these alkaline compounds provided that the compound allows an aqueous solution to be basic. It is preferable that the alkaline compound contained in the alkaline aqueous solution which can be suitably used for a development process for developing the black photosensitive resin composition have a concentration preferably of not less than 0.01 wt % and not more than 20 wt %, and particularly preferably of not less than 0.02 wt % and not more than 10 wt %. Note that it is only necessary to set a temperature of the developer in accordance with a composition of the black photosensitive resin composition or a composition of the developer. The temperature is preferably set generally to not less than 0° C. and not more than 80° C., and more generally to not less than 10° C. and not more than 60° C.

A relief pattern formed by the development process is rinsed so as to remove an unnecessary residual of the developer. A rinse agent is exemplified by water, an acidic aqueous solution, and the like.

Next, a heat treatment is carried out with respect to the relief pattern thus obtained. A cured film which is rich in heat resistance can be obtained by carrying out the heat treatment so as to react a reactive group remaining in a molecular structure of the black photosensitive resin composition. The cured film, whose thickness is determined in view of a wire thickness and the like, preferably has a thickness of approximately not less than 2 μm and not more than 50 μm. It is desirable that a final curing temperature in the heat treatment be a lower temperature so as to prevent (i) oxidation of a wire and the like and (ii) a deterioration in adhesiveness between a wire and a base material.

In the heat treatment, curing is carried out at a temperature preferably of not less than 100° C. and not more than 250° C., more preferably of not less than 120° C. and not more than 200° C., and particularly preferably of not less than 130° C. and not more than 180° C. A final heating temperature which is higher than 250° C. is undesirable since such a temperature accelerates a deterioration in wire by oxidation.

A cured film formed from the black photosensitive resin composition in accordance with the present invention is excellent in coverability, excellent in flexibility, and small in post-curing warpage of a substrate.

Further, for example, an insulating film obtainable from the black photosensitive resin composition has a film thickness preferably of approximately not less than 2 μm and not more than 50 μm, and has a resolving power of at least 10 μm, particularly of approximately not less than 10 μm and not more than 1000 μm after having been subjected to photo-curing. Therefore, the insulating film obtainable from the black photosensitive resin composition is particularly suitable as an insulating material for a flexible circuit board. In addition, the insulating film obtainable from the black photosensitive resin composition is used for various photocurable wire coating protective agents, photosensitive heat-resistant adhesives, electric wire and cable insulating coatings, or the like.

Note that the present invention makes it possible to provide a similar insulating material also by use of a resin film which is obtained by applying, to a substrate surface, the black photosensitive resin composition or the solution of the black photosensitive resin composition, and drying the black photosensitive resin composition or the solution of the black photosensitive resin composition.

EXAMPLES

The following description more specifically describes the present invention with reference to Examples. However, the present invention is not limited by the Examples.

Synthesis Example 1

(A) Binder Polymer 1

100.0 g of methyltriglyme (=1,2-bis(2-methoxyethoxy) ethane) was poured, as a solvent for polymerization, into a reaction container provided with a stirrer, a thermometer, a dropping funnel, a cooling pipe, and a nitrogen inlet tube, and heated to 80° C. under stirring in nitrogen gas stream. 12.0 g (0.14 mole) of methacrylic acid, 28.0 g (0.16 mole) of benzyl methacrylate, 60.0 g (0.42 mole) of butyl methacrylate, and 0.5 g of azobisisobutyronitrile as a radical polymerization initiator which had been mixed in advance at a room temperature were dropped from the dropping funnel to the methyltriglyme over 3 hours with their temperature maintained at 80° C. After the dropping, a reaction solution was heated to 90° C. under stirring, and the reaction solution was stirred, while being heated, so as to be reacted for another two hours while being maintained at 90° C. The reaction made it possible to obtain a solution of an acrylic resin having a carboxyl group in its molecule. The resin solution thus obtained had a solid content concentration of 50%, a weight average molecular weight of 48,000, and an acid value of the solid content of 78 mgKOH/g. Note that the solid content concentration, the weight average molecular weight, and the acid value were measured by the following method.

<Solid Content Concentration>

The measurement was carried out in accordance with JIS K 5601-1-2. Note that drying was carried out at 170° C. for 1 hour.

<Weight Average Molecular Weight>

The measurement was carried out under the following condition.

Used device: counterpart of HLC-8220GPC manufactured by TOSOH CORPORATION
Column: TSK gel Super AWM-H (6.0 mm I. D.×15 cm) manufactured by TOSOH CORPORATION×2
Guard column: TSK guard column Super AW-H manufactured by TOSOH CORPORATION
Eluent: 30 mM LiBr+20 mM $H_3PO_4$ in DMF
Flow rate: 0.6 mL/min
Column temperature: 40° C.
Detection condition: RI: polarity (+), response (0.5 sec)
Sample concentration: approximately 5 mg/mL
Standard sample: PEG (polyethylene glycol)

<Acid Value>

The measurement was carried out in accordance with JIS K 5601-2-1.

Synthesis Example 2

(A) Binder Polymer 2

30.00 g of methyltriglyme (=1,2-bis(2-methoxyethoxy) ethane) was poured, as a solvent for polymerization, into a reaction container provided with a stirrer, a thermometer, a dropping funnel, a cooling pipe, and a nitrogen inlet tube, and 10.31 g (0.050 mole) of norbornene diisocyanate was added to the solvent. A resultant solution was heated to 80° C. so as to be dissolved under stirring in nitrogen gas stream. To this solution, a solution was dropped from the dropping funnel over 1 hour, the solution obtained by dissolving, in 30.00 g of methyltriglyme, 50.00 g (0.025 mole) of polycarbonate diol (PCDL T5652 (trade name) manufactured by Asahi Kasei Corp., having a weight average molecular weight of 2,000) and 6.51 g (0.050 mole) of 2-hydroxyethyl methacrylate. After the dropping, a resultant solution was stirred, while being heated, so as to be reacted at 80° C. for 5 hours. The reaction made it possible to obtain a solution of a resin having, in its molecule, a urethane bond and a methacryloyl group. The resin solution thus obtained had a solid content concentration of 53% and a weight average molecular weight of 5,200. Note that the solid content concentration and the weight average molecular weight were measured as in the case of the Synthesis Example 1.

Synthesis Example 3

(A) Binder Polymer 3

30.00 g of methyltriglyme (=1,2-bis(2-methoxyethoxy) ethane) was poured, as a solvent for polymerization, into a reaction container provided with a stirrer, a thermometer, a dropping funnel, a cooling pipe, and a nitrogen inlet tube, and 10.31 g (0.050 mole) of norbornene diisocyanate was added to the solvent. A resultant solution was heated to 80° C. so as to be dissolved under stirring in nitrogen gas stream. To this solution, a solution was dropped from the dropping funnel over 1 hour, the solution obtained by dissolving, in 30.00 g of methyltriglyme, 50.00 g (0.025 mole) of polycarbonate diol (PCDL T5652 (trade name) manufactured by Asahi Kasei Corp., having a weight average molecular weight of 2,000) and 3.70 g (0.025 mole) of 2,2-bis(hydroxymethyl)butanoic acid. After the dropping, a resultant solution was stirred, while being heated, so as to be reacted at 80° C. for 5 hours. The reaction made it possible to obtain a solution of a resin having, in its molecule, a urethane bond and a carboxyl group. The resin solution thus obtained had a solid content concentration of 52%, a weight average molecular weight of 5,600, and an acid value of the solid content of 22 mgKOH/g. Note that the solid content concentration, the weight average molecular weight, and the acid value were measured as in the case of the Synthesis Example 1.

Synthesis Example 4

(A) Binder Polymer 4

40.00 g of methyltriglyme (=1,2-bis(2-methoxyethoxy) ethane) was poured, as a solvent for polymerization, into a reaction container provided with a stirrer, a thermometer, a dropping funnel, a cooling pipe, and a nitrogen inlet tube, and 20.62 g (0.100 mole) of norbornene diisocyanate was added to the solvent. A resultant solution was heated to 80° C. so as to be dissolved under stirring in nitrogen gas stream. To this solution, a solution was dropped from the dropping funnel over 1 hour, the solution obtained by dissolving, in 40.00 g of methyltriglyme, 50.00 g (0.025 mole) of polycarbonate diol (PCDL T5652 (trade name) manufactured by Asahi Kasei Corp., having a weight average molecular weight of 2,000), 3.70 g (0.025 mole) of 2,2-bis(hydroxymethyl)butanoic acid, and 13.02 g (0.100 mole) of 2-hydroxyethyl methacrylate. After the dropping, a resultant solution was stirred, while being heated, so as to be reacted at 80° C. for 5 hours. The reaction made it possible to obtain a solution of a resin having, in its molecule, a urethane bond, and a carboxyl group and a (meth)acryloyl group. The resin solution thus obtained had a solid content concentration of 52%, a weight average molecular weight of 8,600, and an acid value of the solid content of 18 mgKOH/g. Note that the solid content concentration, the weight average molecular weight, and the acid value were measured as in the case of the Synthesis Example 1.

Synthesis Example 5

(A) Binder Polymer 5

35.00 g of methyltriglyme (=1,2-bis(2-methoxyethoxy) ethane) was poured, as a solvent for polymerization, into a reaction container provided with a stirrer, a thermometer, a dropping funnel, a cooling pipe, and a nitrogen inlet tube, and 10.31 g (0.050 mole) of norbornene diisocyanate was added to the solvent. A resultant solution was heated to 80° C. so as to be dissolved under stirring in nitrogen gas stream. To this solution, a solution was dropped from the dropping funnel over 1 hour, the solution obtained by dissolving, in 35.00 g of methyltriglyme, 50.00 g (0.025 mole) of polycarbonate diol (PCDL T5652 (trade name) manufactured by Asahi Kasei Corp., having a weight average molecular weight of 2,000). After the dropping, a resultant solution was stirred, while being heated, so as to be reacted at 80° C. for 2 hours. After the reaction was ended, 15.51 g (0.050 mole) of 3,3',4,4'-oxydiphthalic dianhydride (hereinafter referred to as ODPA) was added to the reaction solution. After the addition, a resultant solution was heated to 190° C. so as to be reacted for 1 hour. The reacted solution was cooled to 80° C., and 3.60 g (0.200 mole) of pure water was added to the cooled solution. After the addition, a resultant solution was heated to 110° C. so as to be refluxed, while being heated, for 5 hours. The reaction made it possible to obtain a solution of a resin having, in its molecule, a urethane bond, and a carboxyl group and an imide group. The resin solution thus obtained had a solid content concentration of 53%, a weight average molecular weight of 9,200, and an acid value of the solid content of 86 mgKOH/g. Note that the solid content concentration, the weight average molecular weight, and the acid value were measured as in the case of the Synthesis Example 1.

Examples 1 Through 10

Preparation of Black Photosensitive Resin Composition

Black photosensitive resin compositions in accordance with respective Examples 1 through 10 were prepared by adding, to (A) the binder polymers 1 through 5 obtained in the respective Synthetic Examples 1 through 5, (B) the thermosetting resin, (C) the flame retardant which is substantially insoluble in an organic solvent, (D) the photopolymerization initiator, (E) the black colorant, (F) the organic solvent, (G) the spherical organic beads, and the other components. Table 1 shows (i) amounts in which raw materials for each of the black photosensitive resin compositions are mixed in a resin solid content and (ii) kinds of the raw materials. Note that an amount of 1,2-bis(2-methoxyethoxy)ethane, which is (F) the organic solvent shown in Table 1, indicates a total amount of a solvent including a solvent which is contained in the resin solution synthesized as described earlier. First, the black photosensitive resin compositions were subjected to mixing by use of a general stirring device provided with a stirring vane. Subsequently, the black photosensitive resin compositions were passed through a triple roll mill two times so as to be uniform solutions. Respective particle diameters of the black photosensitive resin compositions contained in the mixed solutions were measured by use of a grindmeter. As a result of the measurement, the black photosensitive resin compositions each had a particle diameter of not more than 10 μm. After the mixed solutions were each completely defoamed in a defoaming device, and the following evaluation was carried out.

TABLE 1

Unit: parts by weight

|  |  | Ex. 1 | Ex. 2 | Ex. 3 | Ex. 4 | Ex. 5 |
|---|---|---|---|---|---|---|
| (A) component | Binder polymer 1 | 42.0 | — | — | — | — |
|  | Binder polymer 2 | — | 18.0 | — | — | — |
|  | Binder polymer 3 | — | — | 42.0 | 42.0 | 42.0 |
|  | Binder polymer 4 | 18.0 | — | 18.0 | 18.0 | 18.0 |
|  | Binder polymer 5 | — | 42.0 | — | — | — |
| (B) component | TEPIC-SP<1> | 10.0 | 10.0 | 10.0 | 10.0 | 10.0 |
| (C) component | EXOLIT OP-935 <2> | 20.0 | 20.0 | 20.0 | 20.0 | 20.0 |
|  | MELAPUR MC <3> | — | — | — | — | — |
|  | APYRAL AOH60 <4> | — | — | — | — | — |
| (D) component | IRUGACURE OXE-02 <5> | 1.0 | 1.0 | 1.0 | 1.0 | 1.0 |
| (E) component | Black6350 <6> | 20.0 | 20.0 | 20.0 | — | — |
|  | Black6301 <7> | — | — | — | 20.0 | — |
|  | Black6303 <8> | — | — | — | — | 20.0 |
|  | Paliogen Black S0084 <9> | — | — | — | — | — |
| (G) component | Ganz Pearl GM-0401S <10> | — | — | — | — | — |
|  | DAIMICBEAZ UCN-8070 CM Clear <11> | — | — | — | — | — |
| Other components | FANCRYL FA-321M <12> | 15.0 | 15.0 | 15.0 | 15.0 | 15.0 |
|  | FLOWLEN AC-2000 <13> | 1.0 | 1.0 | 1.0 | 1.0 | 1.0 |
| (F) component | 1,2-bis(2-methoxyethoxy)ethane | 100.0 | 100.0 | 100.0 | 100.0 | 100.0 |

|  |  | Ex. 6 | Ex. 7 | Ex. 8 | Ex. 9 | Ex. 10 |
|---|---|---|---|---|---|---|
| (A) component | Binder polymer 1 | — | — | — | — | — |
|  | Binder polymer 2 | — | — | — | — | — |
|  | Binder polymer 3 | 42.0 | 42.0 | 42.0 | 42.0 | 42.0 |
|  | Binder polymer 4 | 18.0 | 18.0 | 18.0 | 18.0 | 18.0 |
|  | Binder polymer 5 | — | — | — | — | — |
| (B) component | TEPIC-SP<1> | 10.0 | 10.0 | 10.0 | 10.0 | 10.0 |
| (C) component | EXOLIT OP-935 <2> | 20.0 | — | — | 20.0 | 20.0 |
|  | MELAPUR MC <3> | — | 20.0 | — | — | — |
|  | APYRAL AOH60 <4> | — | — | 20.0 | — | — |
| (D) component | IRUGACURE OXE-02 <5> | 1.0 | 1.0 | 1.0 | 1.0 | 1.0 |

TABLE 1-continued

| | | | | | | Unit: parts by weight |
|---|---|---|---|---|---|---|
| (E) component | Black6350 <6> | — | 20.0 | 20.0 | 20.0 | 20.0 |
| | Black6301 <7> | — | — | — | — | — |
| | Black6303 <8> | — | — | — | — | — |
| | Paliogen Black S0084 <9> | 5.0 | — | — | — | — |
| (G) component | Ganz Pearl GM-0401S <10> | — | — | — | 30.0 | — |
| | DAIMICBEAZ UCN-8070 CM Clear <11> | — | — | — | — | 30.0 |
| Other components | FANCRYL FA-321M <12> | 15.0 | 15.0 | 15.0 | 15.0 | 15.0 |
| | FLOWLEN AC-2000 <13> | 1.0 | 1.0 | 1.0 | 1.0 | 1.0 |
| (F) component | 1,2-bis(2-methoxyethoxy)ethane | 100.0 | 100.0 | 100.0 | 100.0 | 100.0 |

Abbreviation:
Ex. stands for Example.

Note that the following description explains <1> through <13> in Table 1.

<1> Trade name of polyfunctional epoxy resin (triglycidyl isocyanurate) manufactured by NISSAN CHEMICAL INDUSTRIES, LTD.

<2> Trade name of phosphinate manufactured by Clariant Japan K.K., having solubility of less than 0.01 part by weight with respect to 100 parts by weight of 1,2-bis(2-methoxyethoxy)ethane <3> Trade name of melamine cyanurate manufactured by BASF Japan Ltd., having solubility of less than 0.01 part by weight with respect to 100 parts by weight of 1,2-bis(2-methoxyethoxy)ethane <4> Trade name of boehmite aluminum hydroxide manufactured by Nabaltec, having solubility of less than 0.01 part by weight with respect to 100 parts by weight of 1,2-bis(2-methoxyethoxy)ethane <5> Trade name of an oxime ester photopolymerization initiator manufactured by BASF Japan Ltd.

<6> Trade name of a black colorant (metal composite oxide) manufactured by ASAHI KASEI KOGYO CO., LTD.

<7> Trade name of a black colorant (metal composite oxide) manufactured by ASAHI KASEI KOGYO CO., LTD.

<8> Trade name of a black colorant (metal composite oxide) manufactured by ASAHI KASEI KOGYO CO., LTD.

<9> Trade name of a black colorant (organic pigment) manufactured by BASF Japan Ltd.

<10> Trade name of cross-linked polymethylmethacrylate spherical organic beads manufactured by GANZ CHEMICAL CO., LTD., having an average particle diameter of 4 μm <11> Trade name of cross-linked urethane spherical organic beads manufactured by Dainichiseika Color & Chemicals Mfg. Co., Ltd., having an average particle diameter of 7 μm <12> Trade name of bisphenol-A EO-modified dimethacrylate manufactured by Hitachi Chemical Co., Ltd.

<13> Trade name of a butadiene antifoaming agent manufactured by KYOEISHA CHEMICAL CO., LTD.

<Preparation of Coating Film on Polyimide Film>

The black photosensitive resin compositions in accordance with Examples 1 through 10 were each casted and applied, by use of a Baker's applicator, to an area of 100 mm×100 mm of a polyimide film (25NPI, (trade name) manufactured by Kaneka Corporation) having a thickness of 25 μm as a base material so that a black photosensitive resin composition had a final dry thickness of 20 μm, and a resin film was obtained by drying the black photosensitive resin composition at 80° C. for 20 minutes. Thereafter, the resin film was subjected to light exposure by being irradiated with ultraviolet light in an accumulated amount of 300 mJ/cm$^2$. Subsequently, the black photosensitive resin composition was subjected to spray development, with a 1.0 wt % sodium carbonate aqueous solution heated to 30° C., at a discharge pressure of 1.0 kgf/mm$^2$ for 90 seconds. After being sufficiently rinsed with pure water after the spray development, the black photosensitive resin composition was thermally cured in an oven at 150° C. for 30 minutes. In this way, a cured film laminated film was prepared by forming a cured film (insulating film) of the black photosensitive resin composition on the polyimide film.

<Evaluation of Cured Film Laminated Film>

The obtained cured film laminated film was evaluated in terms of the following items. Table 2 shows a result of the evaluation.

(i) Photosensitivity

Photosensitivity was evaluated by observing a surface of a cured film of a black photosensitive resin composition which cured film had been obtained as in the case of the above <Preparation of coating film on polyimide film>. Note that light exposure was carried out while a negative photolithographic mask in which a line width/space width is 100 μm/100 μm was provided on the resin film. A result of the evaluation is shown by G (Good) or P (Poor) as below.

G (Good): A polyimide film surface had no remarkable line thickening or residue of development, and had a photosensitive pattern in which a line width/space width is 100 μm/100 μm.

P (Poor): A polyimide film surface had no photosensitive pattern in which a line width/space width is 100 μm/100 μm.

(ii) Bending Resistance

As in the case of the above <Preparation of coating film on polyimide film>, a cured film laminated film was prepared by forming, on a surface of a polyimide film (Apical 25NPI (trade name) manufactured by Kaneka Corporation) having a thickness of 25 μm as a base material, a cured film of a black photosensitive resin composition having a final dry thickness of 20 μm. Bending resistance of the cured film laminated film was evaluated as below. The cured film laminated film was cut out into strips having a size of 50 mm×10 mm. Each of the strips was bent at 180° at a point of 25 mm from its end (in a central part) with its cured film faced outward, and a load of 5 kg was placed on a bent part for 3 seconds and then removed. Thereafter, the evaluation was carried out by microscopically observing a peak of the bent part. After the microscopic observation, the bent part was opened at 180°. Then, the load of 5 kg was placed again on the opened bent part and then removed, so that the cured film laminated film was completely opened. The above operation was repeatedly carried out, and the number of times of bending at which cracking appeared in the bent part was referred to as the number of times of bending. "The number of times of bending is 1" means that an operation in which the cured film laminated film was bent and then completely opened was carried out 1 time. A result of the evaluation is shown by G (Good), E (Enough), or P (Poor) as below.

G (Good): No cracking appeared in a cured film which had been bent 5 times.

E (Enough): No cracking appeared in a cured film which had been bent 3 times.

P (Poor): Cracking appeared in a cured film which had been bent once.

(iii) Warpage

As in the case of the above <Preparation of coating film on polyimide film>, a cured film laminated film was prepared by forming, on a surface of a polyimide film (Apical 25NPI (trade name) manufactured by Kaneka Corporation) having a thickness of 25 μm as a base material, a cured film of a black photosensitive resin composition having a final dry thickness of 20 μm. FIG. 1 schematically shows how a warpage height of a film is measured. As shown in FIG. 1, an obtained cured film laminated film 1 (polyimide film laminated with a cured film of a black photosensitive resin composition) was cut into a square film having an area of 50 mm×50 mm, and the film was placed on a flat table 3 so that its cured film faced upward. Thus, a warpage height 2 of an end portion of the film was measured. As the cured film laminated film 1 has a lower warpage height 2, smaller stress is exerted on a surface of a printed wiring board. Accordingly, the printed wiring board is warped in a smaller amount. It is therefore preferable that the warpage height 2 be not more than 5 mm. Note that a case where the cured film laminated film 1 rolled up into a tube was evaluated as P (Poor).

(iv) Electric Insulation Reliability

A comb-shaped pattern in which line width/space width is 100 μm/100 μm was prepared on a flexible copper clad laminate (in which electrolytic copper foil has a thickness of 12 μm, a polyimide film is Apical 25NPI (trade name) manufactured by Kaneka Corporation, and the copper foil is adhered by use of a polyimide adhesive). By being immersed in a 10 vol % sulfuric acid aqueous solution for one minute and rinsed with pure water, the flexible copper clad laminate was subjected to a surface treatment in which the copper foil was surface-treated. Then, a cured film of a black photosensitive resin composition having a final dry thickness of 20 μm was formed on the comb-shaped pattern as in the case of the above <Preparation of coating film on polyimide film>. In this way, a test piece (an insulating film-coated printed wiring board, an insulating film-coated flexible printed circuit board) was prepared. In an environmental test device at 85° C. and at RH of 85%, a direct current of 100 V was applied to both ends of the test piece, and a change in insulation resistance values, migration, and the like were observed. A result of the observation is shown by G (Good) or P (Poor) as below.

G (Good): 1000 hours after the start of the test, an insulation resistance value was not less than $10^8$ ohms, and no migration, dendrite formation, or the like was observed.

P (Poor): 1000 hours after the start of the test, migration, dendrite formation, or the like was observed.

(v) Coverability

Coverability was evaluated by a method in which the test piece (cured film laminated film) obtained in the above (iii) Warpage was placed on paper ruled into 1-millimeter squares and the squares were visually observed from above the test piece. A result of the evaluation is shown by G (Good) or P (Poor) as below.

G (Good): No squares were visible.

P (Poor): The squares were visible.

(vi) Outgassing and Film Thinning

Outgassing and film thinning were evaluated by a method in which the test piece (cured film laminated film) obtained in the above (iii) Warpage was subjected to a reflow process under a reflow condition of 260° C. (peak top of 260° C.×20 seconds). A result of the evaluation is shown by G (Good) or P (Poor) as below.

G (Good): It was possible to confirm by visual observation that no outgassing occurred, and there was no change in film thickness of the cured film before and after the test.

P (Poor): It was possible to confirm by visual observation that outgassing occurred, and there was a change in film thickness of the cured film before and after the test.

(vii) Flame Retardancy

In accordance with UL 94VTM, which is a standard for a flammability test of plastic materials, a flammability test was carried out as below. As in the case of the above <Preparation of coating film on polyimide film>, a cured film laminated film was prepared by forming, on both sides of a polyimide film (Apical 25NPI (trade name) manufactured by Kaneka Corporation) having a thickness of 25 μm as a base material, a cured film of a black photosensitive resin composition having a final dry thickness of 20 μm. The cured film laminated film thus prepared was cut out into 20 films so as to have a width of 50 mm, a length of 200 mm, and a thickness of 75 μm (including a thickness of the polyimide film). A marked line was provided to each of the films at a point of 125 mm from a film end. A film was then rolled up into a tube having a diameter of approximately 13 mm and a length of 200 mm with the marked line faced outward. Then, a PI (polyimide) tape was applied to the film so that no gap was found in an upper part of the film (the film end) and in an overlapping portion of the film which overlapping portion is above the marked line (a portion having a length of 75 (=200−125) mm). Twenty samples (tubes) for the flammability test were thus prepared. Among the 20 samples, 10 samples were treated (1) at 23° C. and at a relative humidity of 50% for 48 hours. The remaining 10 samples were treated (2) at 70° C. for 168 hours, and then cooled, for not less than 4 hours, in a desiccator containing anhydrous calcium chloride. An upper part (a side on which the PI tape was applied) of a sample was fixed by use of a clamp so that the sample was fixed upright (so as to be suspended). Then, flames of a burner were brought close to a lower part (a side on which no PI tape was applied) of the sample for 3 seconds so as to ignite the lower part. The flames of the burner were moved away from the lower part after 3 seconds, and it was measured in how many seconds the flames would be extinguished or the sample would stop burning. A result of the measurement is shown by G (Good) or P (Poor) as below.

G (Good): Under each of the above conditions ((1) and (2)), after flames of a burner were moved away from a sample, for all the 10 samples, flames or burning stopped and then self-extinguishing occurred within up to 10 seconds, and burning did not reach a marked line.

P (Poor): Under each of the above conditions ((1) and (2)), after flames of a burner were moved away from a sample, there existed at least one sample which did not self-extinguish within 10 seconds, or flames reached a part of a sample on or upper than a marked line and burnt.

TABLE 2

| Evaluation item | Ex. 1 | Ex. 2 | Ex. 3 | Ex. 4 | Ex. 5 | Ex. 6 |
|---|---|---|---|---|---|---|
| Photosensitivity | G | G | G | G | G | G |
| Bending resistance | G | G | G | G | G | G |
| Warpage (mm) | 1.0 | 1.0 | 0.8 | 0.8 | 0.8 | 0.5 |
| Electric insulation reliability | G | G | G | G | G | G |
| Coverability | G | G | G | G | G | G |
| Outgassing and film thinning | G | G | G | G | G | G |
| Flame retardancy | G | G | G | G | G | G |

| Evaluation item | Ex. 7 | Ex. 8 | Ex. 9 | Ex. 10 | Comp. Ex. 1 | Comp. Ex. 2 |
|---|---|---|---|---|---|---|
| Photosensitivity | G | G | G | G | G | G |
| Bending resistance | G | G | G | G | P | G |
| Warpage (mm) | 1.0 | 1.0 | 0.5 | 0.5 | 3.0 | 2.0 |
| Electric insulation reliability | G | G | G | G | P | P |
| Coverability | G | G | G | G | G | G |
| Outgassing and film thinning | G | G | G | G | P | P |
| Flame retardancy | G | G | G | G | P | P |

Abbreviation:
Ex. stands for Example.
Comp. Ex. stands for Comparative Example.

Comparative Example 1

210.0 g of cresol novolac epoxy resin (EPICLON N-680 (trade name) manufactured by DIC Corporation, having an epoxy equivalence of 210) and 96.4 g of Carbitol acetate were poured into a reaction container provided with a stirrer, a thermometer, a dropping funnel, a cooling pipe, and an air inlet tube after air had been injected into the reaction container. Then, a resultant mixture was dissolved by heating. Subsequently, 0.46 g of hydroquinone as a polymerization inhibitor, and 1.38 g of triphenylphosphine as a reaction catalyst were added to the mixture. A resultant mixture was heated to 95° C. under uniform stirring in air stream. Next, 72.0 g of acrylic acid was poured into the dropping funnel so as to be dropped into the reaction container while being heated at 95° C. to 105° C. After the dropping, a resultant mixture was reacted for approximately 16 hours until the mixture had an acid value of 3.0 KOHmg/g. Then, a resultant reaction solution was cooled to 80° C. to 90° C., and 76.0 g of tetrahydrophthalic anhydride was added to the cooled reaction solution. After the addition, a resultant solution was reacted for 8 hours. The reaction made it possible to obtain a resin solution containing a photo-curable resin. The resin solution thus obtained had a solid content concentration of 65% and an acid value of 78 KOHmg/g. Note that the solid content concentration and the acid value were measured as in the case of the Synthesis Example 1.

Next, a black photosensitive resin composition was prepared by mixing and stirring, and dispersing, by use of a triple roll mill, in 154 g (100 g as a solid content) of the obtained resin solution, 18 g of dipentaerythritol hexaacrylate as a radical polymerizable compound; 15 g of 2-methyl-1-[4-(methylthio)phenyl]-2-morpholinopropane-t-on (Irgacure 907 (trade name) manufactured by BASF Japan Ltd.), 1 g of 2,4-diethylthioxanthone, and 0.1 g of 4,4'-bis(dimethylamino)benzophenone as a photopolymerization initiator; 25 g of bisphenol-A diglycidylether and 15 g of triglycidyl isocyanurate as polyfunctional epoxy resin; 2.2 g of carbon black (Carbon Black M-50 (trade name) manufactured by Mitsubishi Chemical Corporation) as a black pigment; 5 g of melamine as a curing agent; 3 g of a silicone antifoaming agent; 3 g of organic bentonite; 140 g of barium sulfate as a filler; and 18 g of diethylene glycol monoethyl ether acetate. Evaluation of physical properties of the black photosensitive resin composition thus prepared was carried out as in the case of the Example 1. Table 2 shows a result of the evaluation. Note that the black photosensitive resin composition does not contain the (C) component, the (E) component, and the (G) component.

Comparative Example 2

A resin solution in which methacrylic acid, methylmethacrylate, and butyl acrylate had been copolymerized in a ratio of 17:62:21 (a solution which was a resin solution having a weight average molecular weight of 110,000 and an acid value of a solid content of 110 mgKOH/g and in which a resin had been dissolved in methyl cellosolve/toluene (weight ratio: 6/4) so as to have a solid content concentration of 40%) was prepared as a binder polymer. A black photosensitive resin composition was prepared by mixing and stirring, and dispersing, by use of a triple roll mill, in 150 g (60 g as a solid content) of the resin solution, 15.4 g (10 g as a solid content) of urethane-modified epoxy acrylate resin (KAYARAD UXE-3024 (trade name) manufactured by Nippon Kayaku Co., Ltd., having a solid content concentration of 65%, a weight average molecular weight of 10,000, and an acid value of the solid content of 60 mgKOH/g) and 45 g as a solid content of urethane-unsaturated oligomer (a photopolymerized compound obtained by reacting 3 mole of a polycarbonate compound having a hydroxyl group at its end, 4 mole of isophorone diisocyanate, and 2 mole of 2-hydroxyethyl acrylate) as a urethane bond-containing resin; 1.5 g of carbon black as a black pigment; 30 g of bisphenol-A skeleton ethylene oxide modified dimethacrylate as a radical polymerizable compound; 2.5 g of 2-benzyl-2-dimethylamino-1-(4-morpholinophenyl)-butanone-1 (Irgacure 369 (trade name) manufactured by BASF Japan Ltd.) as a photopolymerization initiator; 17 g of a melamine derivative as a thermosetting resin; and 45 g of methylethylketone and 20 g of toluene as the other components. Evaluation of physical properties of the black photosensitive resin composition thus prepared was carried out as in the case of the Example 1. Table 2 shows a result of the evaluation. Note that the black photosensitive resin composition does not contain the (C) component, the (E) component, and the (G) component.

INDUSTRIAL APPLICABILITY

A black photosensitive resin composition in accordance with the present invention is usable for, for example, protective films of various circuit boards.

REFERENCE SIGNS LIST

1 Cured film laminated film (Polyimide film laminated with cured film of black photosensitive resin composition)
2 Warpage height
3 Flat table

The invention claimed is:
1. A black photosensitive resin composition comprising
(A) a binder polymer that is a resin comprising, in a molecule, a urethane bond, a carboxyl group and a (meth)acryloyl group;
(B) a thermosetting resin that is a polyfunctional epoxy resin;

(C) a flame retardant which is dissolved in 100 parts by weight of an organic solvent at a room temperature in an amount of less than 0.1 parts by weight;
(D) a photopolymerization initiator that is an oxime ester photopolymerization initiator;
(E) a black colorant which reflects light having a wavelength falling within an infrared range and that is a metal composite oxide or an organic pigment;
(F) an organic solvent; and (G) spherical organic beads; the flame retardant (C) being a phosphinate.

2. The black photosensitive resin composition as set forth in claim 1, wherein the metal composite oxide contains at least one kind selected from the group consisting of iron, chromium, manganese, and bismuth.

3. The black photosensitive resin composition as set forth in claim 1, wherein the organic pigment is a perylene compound.

4. A resin film obtainable by applying, to a substrate surface, the black photosensitive resin composition recited in claim 1, and drying the black photosensitive resin composition.

5. An insulating film obtainable by curing the resin film recited in claim 4.

6. An insulating film-coated printed wiring board comprising a printed wiring board coated with the insulating film recited in claim 5.

7. An insulating film-coated flexible printed circuit board comprising a flexible printed circuit board coated with the insulating film recited in claim 5.

* * * * *